(12) United States Patent
Yoshimura et al.

(10) Patent No.: US 9,373,520 B2
(45) Date of Patent: Jun. 21, 2016

(54) MULTILAYER FILM ETCHING METHOD AND PLASMA PROCESSING APPARATUS

(71) Applicant: TOKYO ELECTRON LIMITED, Tokyo (JP)

(72) Inventors: Shota Yoshimura, Miyagi (JP); Eiji Suzuki, Miyagi (JP); Tomiko Kamada, Miyagi (JP); Hiroto Ohtake, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/603,579

(22) Filed: Jan. 23, 2015

(65) Prior Publication Data

US 2015/0140822 A1  May 21, 2015

Related U.S. Application Data

(63) Continuation of application No. PCT/JP2013/070606, filed on Jul. 30, 2013.

(30) Foreign Application Priority Data

Aug. 9, 2012  (JP) .................................. 2012-177198

(51) Int. Cl.
*H01L 21/302* (2006.01)
*H01L 21/311* (2006.01)
(Continued)

(52) U.S. Cl.
CPC ........... *H01L 21/311* (2013.01); *H01J 37/3222* (2013.01); *H01J 37/32449* (2013.01);
(Continued)

(58) Field of Classification Search
CPC .................. H01L 21/31144; H01L 21/31116; H01L 21/31138; H01L 21/32139; H01J 37/32192; H01J 37/32229
USPC ............ 438/689, 706, 710, 723, 737; 216/67, 216/69
See application file for complete search history.

(56) References Cited

U.S. PATENT DOCUMENTS 8,263,496 B1 * 9/2012 Wodecki ........... H01L 21/31116
216/22
2007/0224829 A1 * 9/2007 Ji ...................... H01L 21/31116
438/710

(Continued)

FOREIGN PATENT DOCUMENTS

JP       2009-170661 A    7/2009
JP       2011-3722 A      1/2011
WO       2011/019790 A1   2/2011

OTHER PUBLICATIONS

International Search Report mailed Oct. 29, 2013 in PCT/JP2013/070606 (3 pages).

*Primary Examiner* — Hsien Ming Lee
(74) *Attorney, Agent, or Firm* — Rothwell, Figg, Ernst & Manbeck, P.C.

(57) ABSTRACT

In one embodiment of the present invention, there is provided a method for etching a multilayer film formed by laminating a plurality of alternating layers of a first layer having a first dielectric constant and a second layer having a second dielectric constant. This method includes (a) a multilayer film etching step, in which an etchant gas is supplied into a processing chamber and a microwave is supplied into the processing chamber to excite a plasma of the etchant gas; and (b) a resist mask reducing step in which an oxygen-containing gas and a fluorocarbon-based gas are supplied to the processing chamber and a microwave is supplied into the processing chamber to excite a plasma of the oxygen-containing gas and the fluorocarbon-based gas. In this method, the steps (a) and (b) are alternately repeated.

12 Claims, 19 Drawing Sheets

(51) Int. Cl.
  *H01L 21/027* (2006.01)
  *H01L 21/3213* (2006.01)
  *H01L 21/67* (2006.01)
  *H01L 27/115* (2006.01)
  *H01J 37/32* (2006.01)

(52) U.S. Cl.
  CPC ...... *H01L21/0273* (2013.01); *H01L 21/31116* (2013.01); *H01L 21/31138* (2013.01); *H01L 21/31144* (2013.01); *H01L 21/32137* (2013.01); *H01L 21/67069* (2013.01); *H01J 37/32192* (2013.01); *H01J 2237/327* (2013.01); *H01J 2237/334* (2013.01); *H01L 27/11524* (2013.01)

(56) References Cited

U.S. PATENT DOCUMENTS

| | | | |
|---|---|---|---|
| 2010/0317188 A1* | 12/2010 | Nishizawa | C23C 16/26 438/643 |
| 2010/0323505 A1 | 12/2010 | Ishikawa et al. | |
| 2011/0039355 A1 | 2/2011 | Zhao et al. | |

* cited by examiner

MULTILAYER FILM ETCHING METHOD AND PLASMA PROCESSING APPARATUS

CROSS REFERENCE TO RELATED APPLICATION

This application is a Continuation Application of PCT International Application No. PCT/JP2013/070606 filed on Jul. 30 2013, which designated the United States, and claims priority to Japanese Patent Application No. 2012-177198, filed on Aug. 9, 2012. The contents of both the PCT application and the Japanese Patent Application are incorporated herein by reference.

FIELD OF THE INVENTION

The present invention relates to a multilayer film etching method and a plasma processing apparatus.

BACKGROUND OF THE INVENTION

In semiconductor device manufacture, a processing such as etching or film formation is performed on a target object to be processed by the action of a plasma on the target object. As an example of the semiconductor device manufactured by such processing, there is known a NAND flash memory described in, e.g., Patent Document 1.

The NAND flash memory described in Patent Document 1 includes a multilayer film formed by laminating a plurality of alternating layers of a first layer having a first dielectric constant and a second layer having a second dielectric constant. The multilayer film has a stepped structure.

In order for the multilayer film to have the stepped structure in the method described in Patent Document 1, there is used a multilayer mask formed by alternately laminating two layers capable of being selectively etched.

Patent Document 1: Japanese Patent Application Publication No. 2009-170661

In the method described in Patent Document 1 described above, it takes time to form a plurality of layers constituting the multilayer mask on the multilayer film. Accordingly, the present inventors have developed a method of providing a resist mask on the multilayer film, and alternately repeating the etching of the multilayer film and the trimming of the resist mask, namely, the reduction of the width of the resist mask. The trimming of the resist mask may be carried out by exciting a plasma of oxygen gas above the resist mask, and etching the resist mask by oxygen active species such as oxygen ions and oxygen radicals.

In general, the resist mask is easily etched in a vertical direction rather than a horizontal direction in the etching of the resist mask. As a result, (amount of the resist mask etched in the vertical direction)/(amount of the resist mask etched in the horizontal direction), i.e., a trimming ratio, becomes considerably larger than 1. Assuming that the resist mask is etched at such a large trimming ratio, a thick resist mask is required for the multilayer film to have a multistage stepped shape. However, by using the thick resist mask, the material cost may increase, and the exposure accuracy of the resist material may decrease. Alternatively, a method for improving the trimming ratio by performing a deposition process for forming a protective film on the resist mask before the etching of the resist mask may be considered. However, in this method, the throughput is reduced because of the deposition process.

Thus, in the technical field, it has become necessary to make the trimming ratio close to 1 at a high throughput in the etching of the resist mask for forming a stepped shape in the multilayer film.

SUMMARY OF THE INVENTION

In accordance with an aspect of the present invention, there is provided a method for etching a multilayer film formed by laminating a plurality of alternating layers of a first layer having a first dielectric constant and a second layer having a second dielectric constant. A resist mask is formed on the multilayer film. The method comprises the steps of (a) etching the multilayer film by supplying an etchant gas into a processing chamber and supplying a microwave into the processing chamber to excite a plasma of the etchant gas, and (b) reducing the resist mask by supplying an oxygen-containing gas and a fluorocarbon-based gas into the processing chamber and supplying a microwave into the processing chamber to excite a plasma of the oxygen-containing gas and the fluorocarbon-based gas. In the method, the step (a) of etching the multilayer film and the step (b) of reducing the resist mask may be alternately repeated. In the method, the step (a) of etching the multilayer film and the step (b) of reducing the resist mask may be alternately repeated without forming a protective film on the resist mask between the step of etching the multilayer film and the step of reducing the resist mask. In one embodiment, the microwave may be supplied from a radial line slot antenna into the processing chamber.

In this method, the microwave is used to excite a plasma of the oxygen-containing gas and the fluorocarbon-based gas. Therefore, radicals rather than ions are dominantly used as active species that contribute to the reduction of the resist mask. Here, the amount of the resist mask etched in the vertical direction mainly depends on the amount of ions and radicals, and the amount of the resist mask etched in the horizontal direction mainly depends on the amount of radicals. Therefore, in this method, it is possible to make the amount of the resist mask etched in the horizontal direction close to the amount of the resist mask etched in the vertical direction.

Further, in this method, since the fluorocarbon-based gas in addition to the oxygen-containing gas is supplied into the processing chamber, etching of the resist mask using radicals is promoted. Thus, the etching rate of the resist mask is further increased, and it is possible to increase the amount of the resist mask etched in the horizontal direction relative to the amount of the resist mask etched in the vertical direction. As a result, in this method, it is possible to make the trimming ratio close to 1. Further, in this method, it is possible to make the trimming ratio close to 1 without forming a protective film on the resist mask, thereby achieving a high throughput.

In one embodiment, the fluorocarbon-based gas may be $CF_4$ gas. By using the $CF_4$ gas as the fluorocarbon-based gas, the generation of deposits on the resist mask due to the fluorocarbon-based gas is suppressed. As a result, the linearity of an edge of the stepped shape formed in the multilayer film is increased.

In one embodiment, the step (b) of reducing the resist mask is repeated for a predetermined number of cycles, and a period of the step of reducing the resist mask in at least one cycle may be set to be shorter than a period of the step of reducing the resist mask performed in one previous cycle of the at least one cycle. According to the method of this embodiment, the trimming amount in each cycle, i.e., a difference in the amount of the resist mask etched in the horizontal direction becomes smaller. As a result, a difference in width of each stage of the stepped shape is reduced.

In accordance with another aspect of the present invention, there is provided a plasma processing apparatus for forming a stepped shape in a multilayer film, which is formed by laminating a plurality of alternating layers of a first layer having a first dielectric constant and a second layer having a second dielectric constant by using a resist mask formed on the multilayer film. The plasma processing apparatus includes a processing chamber, a gas supply system, a plasma source and a control unit. The gas supply system supplies a first etchant gas for the first layer and a second etchant gas for the second layer, an oxygen-containing gas and a fluorocarbon-based gas into the processing chamber. The plasma source supplies a microwave into the processing chamber. The control unit controls the gas supply system and the plasma source. The control unit alternately repeats a first control for allowing the gas supply system to supply the first and the second etchant gas and allowing the plasma source to supply the microwave, and a second control for allowing the gas supply system to supply the oxygen-containing gas and the fluorocarbon-based gas and allowing the plasma source to supply the microwave. The control unit may alternately repeat the first control and the second control without performing a control of depositing deposits on the resist mask to protect the resist mask between the first control and the second control. In one embodiment, the plasma source may include a radial line slot antenna configured to supply the microwave into the processing chamber.

In the plasma processing apparatus, the microwave is used as a plasma excitation source, and the fluorocarbon-based gas is used in addition to the oxygen-containing gas. Thus, in this apparatus, it is possible to promote the etching of the resist mask using radicals. As a result, it is possible to make the trimming ratio close to 1. Further, it is also possible to make the trimming ratio close to 1 without performing additional control to form a protective film on the resist mask, thereby achieving a high throughput.

In one embodiment, the fluorocarbon-based gas may be $CF_4$ gas. By using the $CF_4$ gas as the fluorocarbon-based gas, the generation of deposits on the resist mask due to the fluorocarbon-based gas is suppressed. As a result, the linearity of the edge of the stepped shape formed in the multilayer film is increased.

In one embodiment, the control unit may repeat the second control for a predetermined number of cycles, and set a period of the second control in at least one cycle to be set shorter than a period of the second control performed in one previous cycle of the at least one cycle. According to the plasma processing apparatus of this embodiment, the trimming amount in each cycle, i.e., a difference in the amount of the resist mask etched in the horizontal direction becomes smaller. As a result, a difference in width of each stage of the stepped shape is reduced.

As described above, according to various aspects and embodiments of the present invention, there are provided the method and the plasma processing apparatus capable of making the trimming ratio close to 1 in the etching of the resist mask for forming the stepped shape in the multilayer film.

DETAILED DESCRIPTION OF THE EMBODIMENTS

Figure 1:
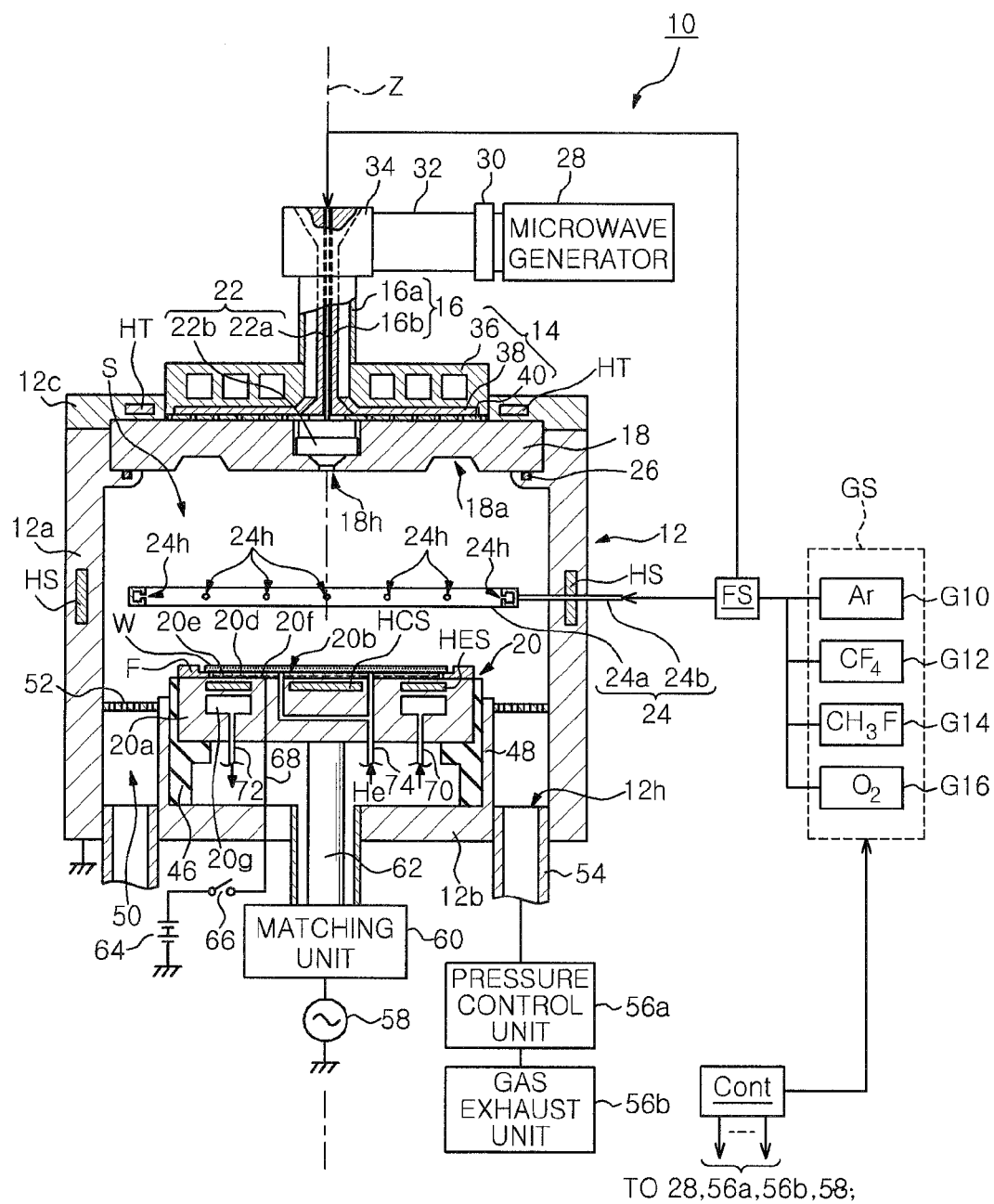
FIG. 1 is a cross-sectional view schematically showing a plasma processing apparatus according to an embodiment.

Hereinafter, various embodiments of the present invention will be described with reference to the accompanying drawings. Throughout the drawings, like reference numerals will be given to like or corresponding parts.

At first, there will be described a plasma processing apparatus according to an embodiment. FIG. 1 is a cross-sectional view schematically showing a plasma processing apparatus according to the embodiment. The plasma processing apparatus 10 shown in FIG. 1 includes a processing chamber 12. The processing chamber 12 defines a processing space S for accommodating the target object W. The processing chamber 12 may include a sidewall 12a, a bottom wall 12b and a ceiling 12c.

The sidewall 12a has a substantially cylindrical shape extending in a direction of an axis Z (hereinafter, referred to as "axis Z direction"). The bottom wall 12b is provided at the lower end side of the sidewall 12a. A gas exhaust hole 12h through which a gas is exhausted is provided in the bottom wall 12b. The sidewall 12a has an open upper end. The open upper end of the sidewall 12a is blocked by a dielectric window 18. The dielectric window is held between the upper end portion of the sidewall 12a and the ceiling 12c. A seal member 26 may be provided between the dielectric window 18 and the upper end portion of the sidewall 12a. The seal member 26 is, e.g., an 0-ring, and contributes to airtight sealing of the processing chamber 12.

The plasma processing apparatus 10 further includes a stage 20 provided in the processing chamber 12. The stage is provided below the dielectric window 18. In the embodiment, the stage 20 includes a base 20a and an electrostatic chuck 20b.

The base 20a is supported by a cylindrical support 46. The cylindrical support 46 is made of an insulating material and extends vertically upwardly from the bottom wall 12b. Further, a conductive cylindrical supporting portion 48 is provided at the outer periphery of the cylindrical support 46. The cylindrical supporting portion 48 extends vertically upwardly from the bottom wall 12b of the processing chamber 12 along the outer periphery of the cylindrical support 46. An annular gas exhaust path 50 is formed between the cylindrical supporting portion 48 and the sidewall 12a.

An annular baffle plate 52 having a plurality of through holes is attached at an upper portion of the gas exhaust path 50. The gas exhaust path 50 is connected to a gas exhaust line 54 having at an end thereof the gas exhaust hole 12h, and a gas exhaust unit 56b is connected to the gas exhaust line 54 via a pressure control unit 56a. The gas exhaust unit 56b includes a vacuum pump such as a turbo molecular pump or the like. The pressure control unit 56a adjusts a pressure in the processing chamber 12 by adjusting the gas exhaust amount of the gas exhaust unit 56b. A pressure in the processing space S in the processing chamber 12 can be depressurized to a desired vacuum level by the pressure control unit 56a and the gas exhaust unit 56b. By operating the gas exhaust unit 56b, a processing gas may be exhausted from the outer periphery of the stage 20 through the gas exhaust path 50.

The base 20a also serves as a high frequency electrode. A high frequency power supply 58 for RF bias is electrically connected to the base 20a via a matching unit 60 and a power supply rod 62. The high frequency power supply 58 outputs a high frequency bias power having a frequency suitable for controlling the energy of ions to be attracted to the target object W, e.g., a frequency of 13.65 MHz, at a predetermined power level. The matching unit 60 accommodates a matcher for matching an impedance of the high frequency power supply 58 and an impedance of a load side which is mainly an electrode, a plasma, the processing chamber 12 and the like. A blocking capacitor for self-bias generation is included in the matcher.

An electrostatic chuck 20b is provided on the top surface of the base 20a. The top surface of the electrostatic chuck 20b serves as a mounting region where the target object W is mounted. The target object W is held on the electrostatic chuck 20b by electrostatic attraction force. A focus ring F annularly surrounds the target object W at a radially outer side of the electrostatic chuck 20b. The electrostatic chuck 20b includes an electrode 20d and insulation films 20e and 20f. The electrode 20d is made of a conductive film and disposed between the insulation films 20e and 20f. A high voltage DC power supply 64 is electrically connected to the electrode 20d through a switch 66 and a coated wire 68. The electrostatic chuck 20b can attract and hold the target object W on the top surface thereof by a coulomb force generated by a DC voltage applied from the DC power supply 64.

An annular coolant path 20g extending in the circumferential direction is provided in the base 20a. A coolant, e.g., cooling water, of a predetermined temperature is supplied from a chiller unit through pipes 70 and 72 and circulated in the coolant path 20g. The processing temperature of the target object W on the electrostatic chuck 20b may be controlled by the temperature of the coolant. Further, a heat transfer gas, e.g., He gas, from a heat transfer gas supply unit is supplied to a gap between the top surface of the electrostatic chuck 20b and the backside of the target object W through a gas supply line 74.

In the present embodiment, the plasma processing apparatus 10 may further include heaters HT, HS, HCS and HES as temperature control units. The heater HT is provided in the ceiling 12c and extends annularly so as to surround an antenna 14. The heater HS is provided in the sidewall 12a and extends annularly. The heater HS may be provided at a position corresponding to an intermediate portion in the height direction (i.e., in the axis Z direction) of the processing space S. The heater HCS is provided in the base 20a. The heater HCS is provided, inside the base 20a, below the central portion of the mounting region, i.e. at a region intersecting with the axis Z. The heater HES is provided in the base 20a and extends annularly so as to surround the heater HCS. The heater HES is provided below the outer peripheral portion of mounting region.

The plasma processing apparatus 10 may further include the antenna 14, a coaxial waveguide 16, a dielectric window 18, a microwave generator 28, a tuner 30, a waveguide 32 and a mode transducer 34. A plasma source according to the embodiment is constituted by the antenna 14, the coaxial waveguide 16, the dielectric window 18, the microwave generator 28, the tuner 30, the waveguide 32 and the mode transducer 34.

The microwave generator 28 generates a microwave having a frequency of, e.g., 2.45 GHz. The microwave generator 28 is connected to an upper portion of the coaxial waveguide 16 via the tuner 30, the waveguide 32 and the mode transducer 34. The coaxial waveguide 16 extends along the axis Z that is a central axis of the coaxial waveguide 16. The coaxial waveguide 16 includes an outer conductor 16a and an inner conductor 16b. The external conductor 16a has a cylindrical shape extending in the axis Z direction. A lower end of the external conductor 16a can be electrically connected to an upper portion of a cooling jacket 36 having a conductive surface. The internal conductor 16b is provided inside of the external conductor 16a. The internal conductor 16b has a cylindrical shape extending along the axis Z. A lower end of the internal conductor 16b is connected to a slot plate 40 of the antenna 14.

In the embodiment, the antenna 14 may be provided inside an opening formed at the ceiling 12c. The antenna 14 has a dielectric plate 38 and the slot plate 40. The dielectric plate 38 for reducing wavelength of a microwave has a substantially disc shape. The dielectric plate 38 is made of, e.g., quartz, or alumina, and disposed between the slot plate 40 and the bottom surface of the cooling jacket 36. Accordingly, the antenna 14 can be formed by the dielectric plate 38, the slot plate 40 and the bottom surface of the cooling jacket 36.

Figure 2:
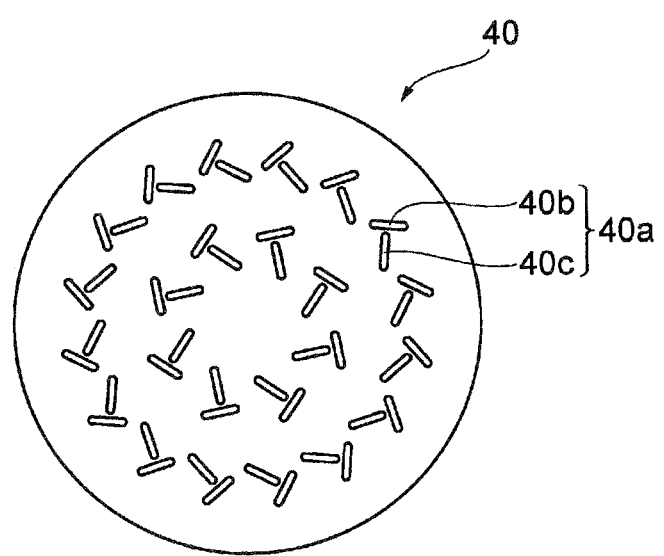
FIG. 2 is a plan view showing an example of a slot plate shown in FIG. 1.

The slot plate 40 is a substantially disc-shaped metal plate having a plurality of slot pairs. In the embodiment, the antenna 14 may be a radial line slot antenna. FIG. 2 is a plan view showing an example of the slot plate. A plurality of slot pairs 40a are formed at the slot plate 40. The slot pairs 40a are spaced from each other at a predetermined interval in a radial direction and also spaced from each other in a circumferential direction. Each slot pair 40a has two slot holes 40b and 40c. The slot holes 40b and 40c extend in a direction intersecting with each other or perpendicular to each other.

Referring back to FIG. 1, in the plasma processing apparatus 10, the microwave generated by the microwave generator 28 propagates to the dielectric plate 38 through the coaxial waveguide 16 and then is applied to the dielectric window 18 through the slot holes of the slot plate 40.

The dielectric window 18 has a substantially disc shape and is made of, e.g., quartz or alumina. A distance between a bottom surface of the dielectric window 18 and the top surface of the electrostatic chuck 20b is, e.g., 245 mm. The dielectric window 18 is disposed directly below the slot plate 40. The microwave from the antenna 14 passes through the dielectric window 18 and then is introduced into the processing space S. Hence, an electric field is generated directly below the dielectric window 18 and a plasma is generated in the processing space. In this manner, the plasma processing apparatus 10 can generate the plasma by using the microwave without applying a magnetic field.

In the embodiment, a recess 18a can be formed at the bottom surface of the dielectric window 18. The recess 18a is provided annularly about the axis Z and has a tapered shape. The recess 18a is provided to facilitate generation of a standing wave by the introduced microwave and can effectively generate the plasma by the microwave.

The plasma processing apparatus 10 further includes a central introducing unit 22, a peripheral introducing unit 24 and a gas supply unit GS. A gas supply system according to the embodiment is constituted by the central introducing unit 22, the peripheral introducing unit 24 and the gas supply unit GS. The central introducing unit 22 injects a gas toward the target object W along the axis Z. The central introducing unit 22 includes a conduit 22a and an injector 22b. The conduit 22a passes through an inner hole of the internal conductor 16b of the coaxial waveguide 16. Further, the conduit 22a extends to the space defined by the dielectric window 18 along the axis Z. The space defined by the dielectric window 18 communicates with a hole 18h. The hole 18h opens toward the processing space S. The injector 22b is provided in the space defined by the dielectric window 18. The injector 22b has a plurality of through holes extending in the axis Z direction. The central introducing unit 22 configured as described above supplies a gas into the injector 22b through the conduit 22a and injects the gas from the injector 22b into the processing space S through the hole 18h.

The peripheral introducing unit 24 includes an annular line 24a and a pipe 24b. The annular line 24a is provided in the processing chamber 12 so as to annularly extend about the axis Z at an intermediate position in the axis Z direction of the processing space S. The annular line 24a has a plurality of gas injection holes 24h that open toward the axis Z. The gas injection holes 24h are annularly arranged about the axis Z. The annular line 24a is connected to the pipe 24b, and the pipe 24b extends to the outside of the processing chamber 12. The peripheral introducing unit 24 introduces the processing gas into the processing space toward the axis Z through the pipe 24b, the annular line 24a and the gas injection holes 24h.

The gas supply unit GS is connected to the central introducing unit 22 and the peripheral introducing unit 24 via a flow splitter FS. The flow splitter FS distributes the gas supplied from the gas supply unit GS to the central introducing unit 22 and the peripheral introducing unit 24 at a distribution ratio set by a control unit to be described later. The gas supply unit GS includes gas sources G10, G12, G14 and G16. The gas sources G10, G12, G14 and G16 are gas sources of Ar gas, $CF_4$ gas, $CH_3F$ gas and $O_2$ gas, respectively. The gas sources G10, G12, G14 and G16 are configured to be able to control flow rates and may include an opening/closing valve and a mass controller.

Alternatively, the plasma processing apparatus 10 may have a configuration in which other gas supply units same as the gas supply unit GS are provided and connected to the central introducing unit 22 and the peripheral introducing unit 24, respectively. Further, the gas supply unit GS may further include gas sources of other gases.

As shown in FIG. 1, the plasma processing apparatus 10 further include a control unit Cont. The control unit Cont may be a controller such as a programmable computer device or the like. The control unit Cont controls the operation of each unit in the plasma processing apparatus 10 based on a program having a recipe. The control unit Cont can transmit a control signal to the gas supply unit GS to control flow rates of gases from the gas sources G10, G12, G14, G16, G18 and G20, a supply of the gases and stop of the supply of the gases. Moreover, the control unit Cont can transmit a control signal to the flow splitter FS to control the distribution ratio of the gas to be distributed to the central introducing unit 22 and the peripheral introducing unit 24. Further, the control unit Cont can transmit control signals to the microwave generator 28, the high frequency power source 58 and the pressure control unit 56a to control the microwave power, the RF bias power and on/off thereof, and the pressure in the processing chamber 12.

Figure 3:
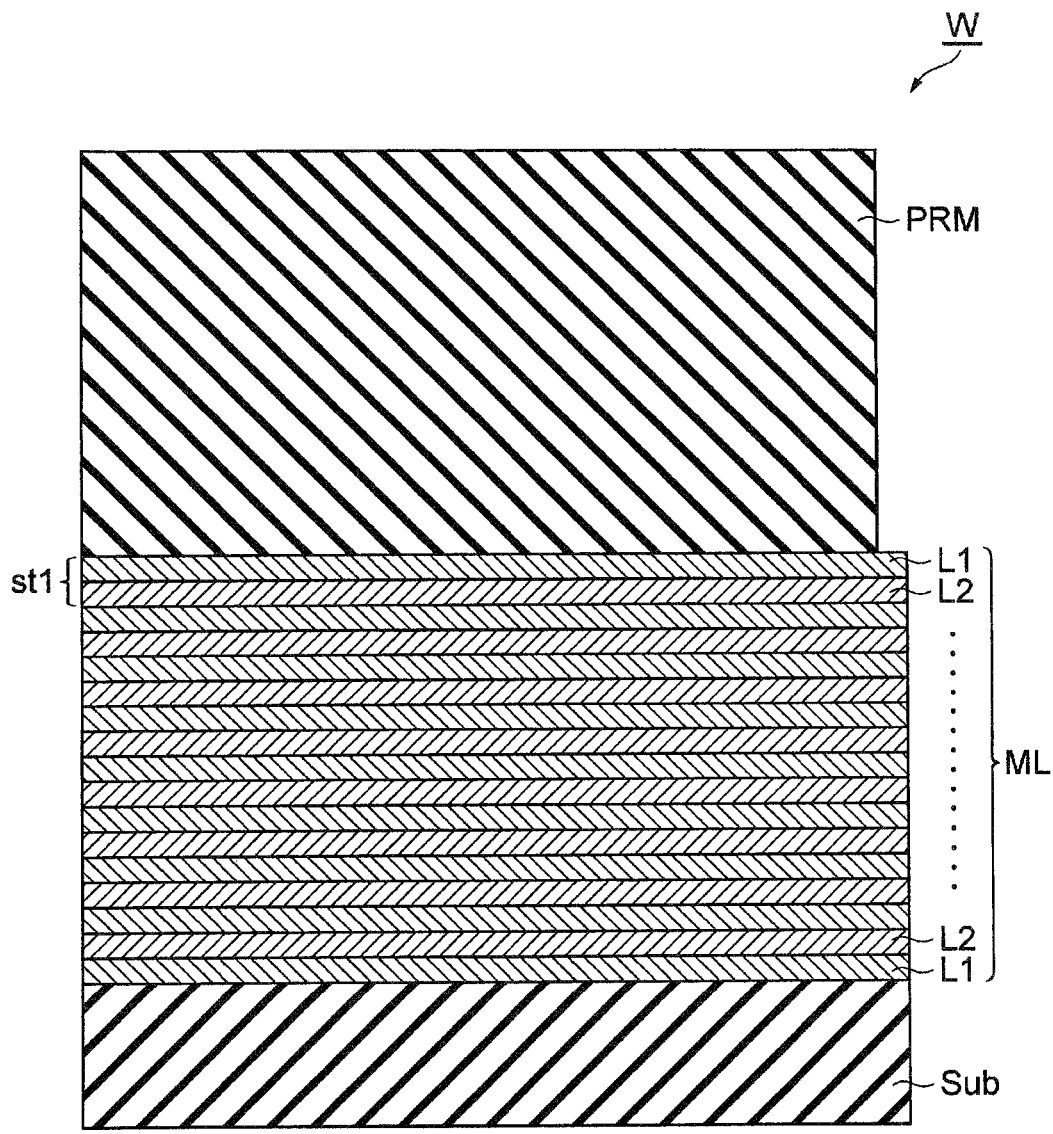
FIG. 3 is a diagram showing a target object to be processed according to the embodiment.

The plasma processing apparatus 10 may be used to etch a multilayer film of the target object such that the multilayer film has a stepped shape. FIG. 3 is a diagram showing the target object W according to an embodiment. As shown in FIG. 3, the target object W includes a substrate Sub, a multilayer film ML formed by laminating a plurality of alternating layers of a first layer L1 and a second layer L2 on the substrate Sub, and a resist mask PRM formed on the multilayer film ML.

In this embodiment, the first layer L1 is a $SiO_2$ layer, and the second layer L2 is a SiN layer. The second layer L2 may be a step-like electrode in, e.g., an NAND type flash memory. The resist mask PRM is made of a resist material such as KrF resist or i-line resist. The resist mask PRM is formed by exposing and developing the resist material formed on the multilayer film ML. The resist mask PRM initially has a pattern to expose an edge portion of the first layer L1 of an uppermost stage st1. For example, the exposed edge portion of the first layer L1 of the uppermost stage st1 has a width of 500 nm.

Figure 4:
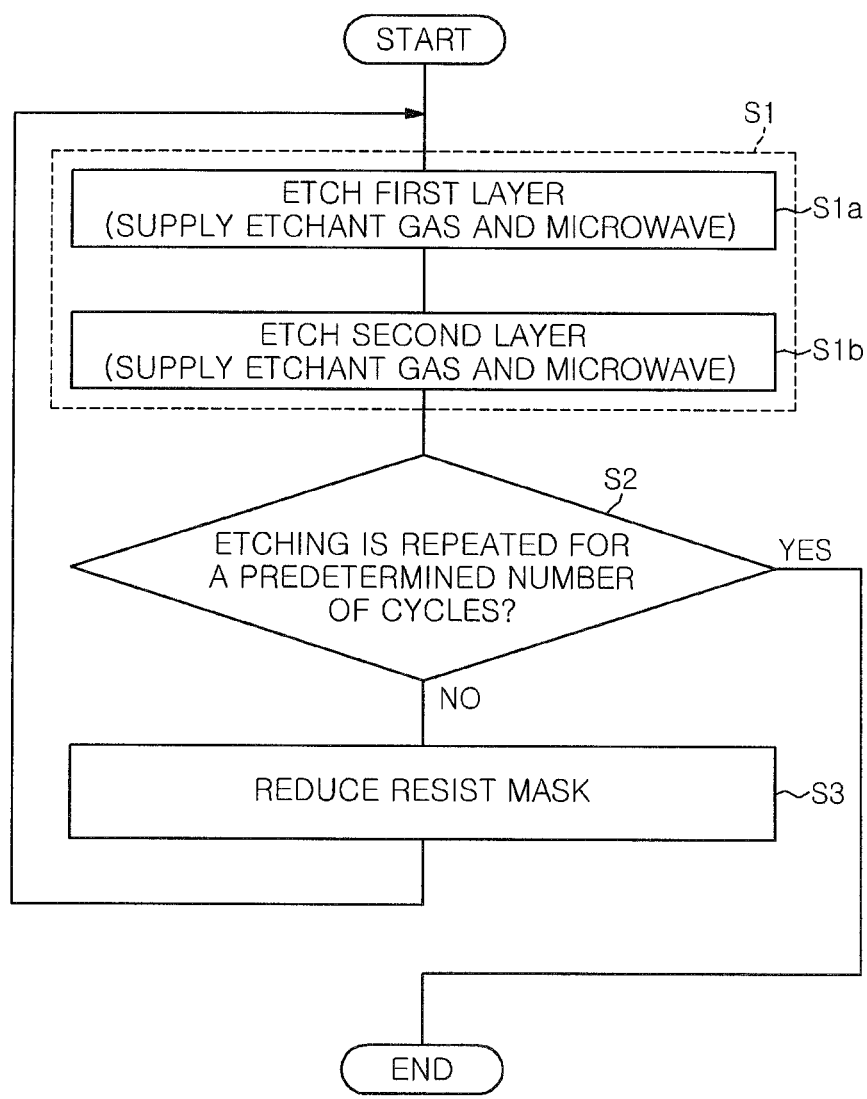
FIG. 4 is a flowchart illustrating a method for etching a multilayer film according to the embodiment.

Hereinafter, there will be described a method for etching a multilayer film according to the embodiment as well as an operation of the plasma processing apparatus 10 when processing the target object W. FIG. 4 is a flowchart showing the method for etching the multilayer film according to the embodiment. The method shown in FIG. 4 includes step S1 of etching the multilayer film and step S3 of reducing the resist mask. The step S1 and step S3 are performed alternately to form a stepped shape in the multilayer film ML.

In the step S1 of the method shown in FIG. 4, the first layer L1 and the second layer L2 are etched. In the step S1 of the first cycle, the first layer L1 and the second layer L2 of the uppermost stage st1 are etched, and a pattern of the resist mask PRM is transferred to the first layer L1 and the second layer L2 of the uppermost stage st1.

Figure 5:
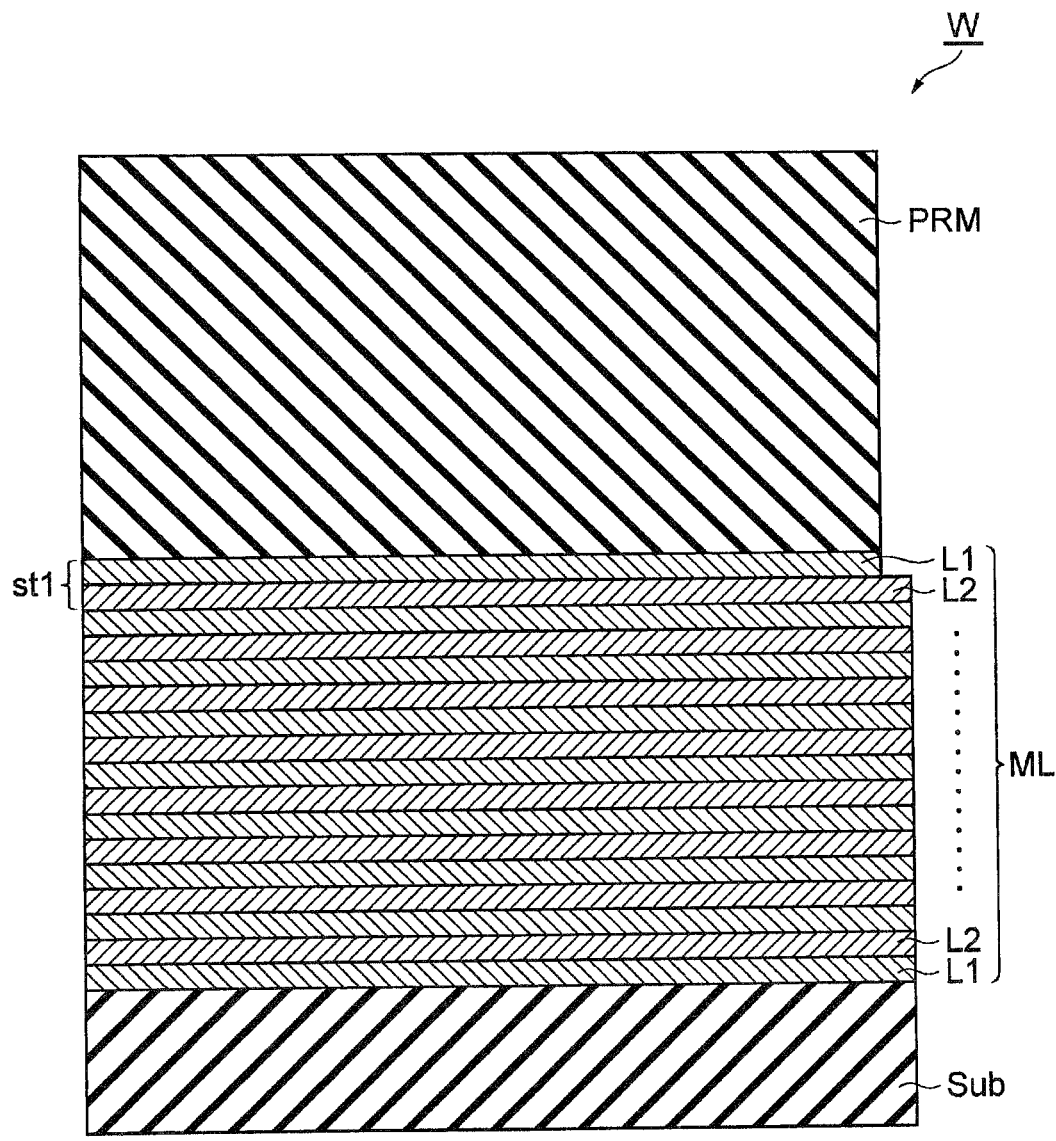
FIGS. 5 to 11 are cross-sectional views showing states of the target object created in respective steps of the method for etching the multilayer film.

The step S1 includes step S1a of etching the first layer L1 and step S1b of etching the second layer L2. In the step S1a, a plasma of an etchant gas for the first layer L1 is excited by using the microwave as an excitation source. In one embodiment, $CF_4$ gas may be used as the etchant gas for the first layer L1. Further, in the step S1a, an inert gas may be used together with the etchant gas. In one embodiment, the inert gas may be Ar gas. In the step S1a of the first cycle, the first layer L1 exposed from the resist mask PRM is etched as shown in FIG. 5.

Figure 6:
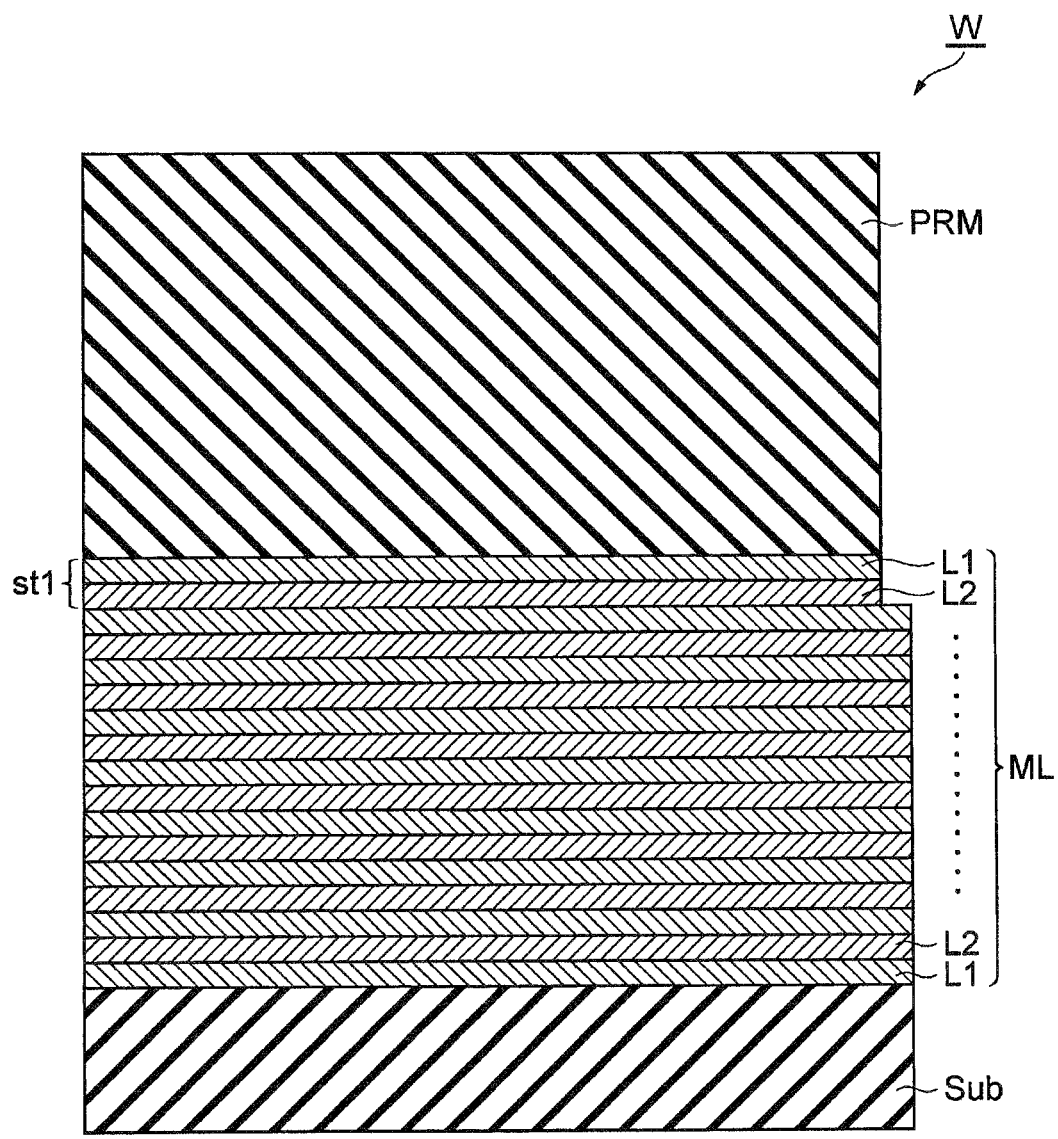

Subsequently, in the step S1b, a plasma of an etchant gas for the second layer L2 is excited by using the microwave as an excitation source. In one embodiment, $CH_3F$ gas may be used as the etchant gas for the second layer L2. Further, in the step S1b, other gases including inert gases may be used together with the etchant gas. In one embodiment, Ar gas and $O_2$ gas are used together with the etchant gas. In the step S1b of the first cycle, as shown in FIG. 6, the second layer L2 being exposed is etched.

When performing the step S1 in the plasma processing apparatus 10, the control unit Cont executes a first control. Specifically, in the first control, the control unit Cont transmits a control signal to allow the microwave generator 28 to generate the microwave, and to allow the gas sources G10 and G12 of the gas supply unit GS to supply Ar gas and $CF_4$ gas into the processing chamber 12. Thus, the plasma of the etchant gas for the first layer L1 is excited, and the first layer L1 being exposed is etched. Then, the control unit Cont transmits a control signal to allow the microwave generator 28 to generate the microwave, and to allow the gas sources G10, G14, and G16 of the gas supply unit GS to supply Ar gas, $CH_3F$ gas, and $O_2$ gas into the processing chamber 12. Thus, the plasma of the etchant gas for the second layer L2 is excited, and the second layer L2 being exposed is etched.

Subsequently, in step S2 of the method, it is determined whether or not the etching of the first layer L1 and the second layer L2 has been repeated for a predetermined number of cycles. In the step S2, if it is determined that the etching of the first layer L1 and the second layer L2 has been repeated for the predetermined number of cycles (if the determination is "Yes"), the method shown in FIG. 4 is terminated. On the other hand, in the step S2, if it is determined that the etching of the first layer L1 and the second layer L2 has not been repeated for the predetermined number of cycles (if the determination is "No"), the method shown in FIG. 4 proceeds to step S3.

Figure 7:
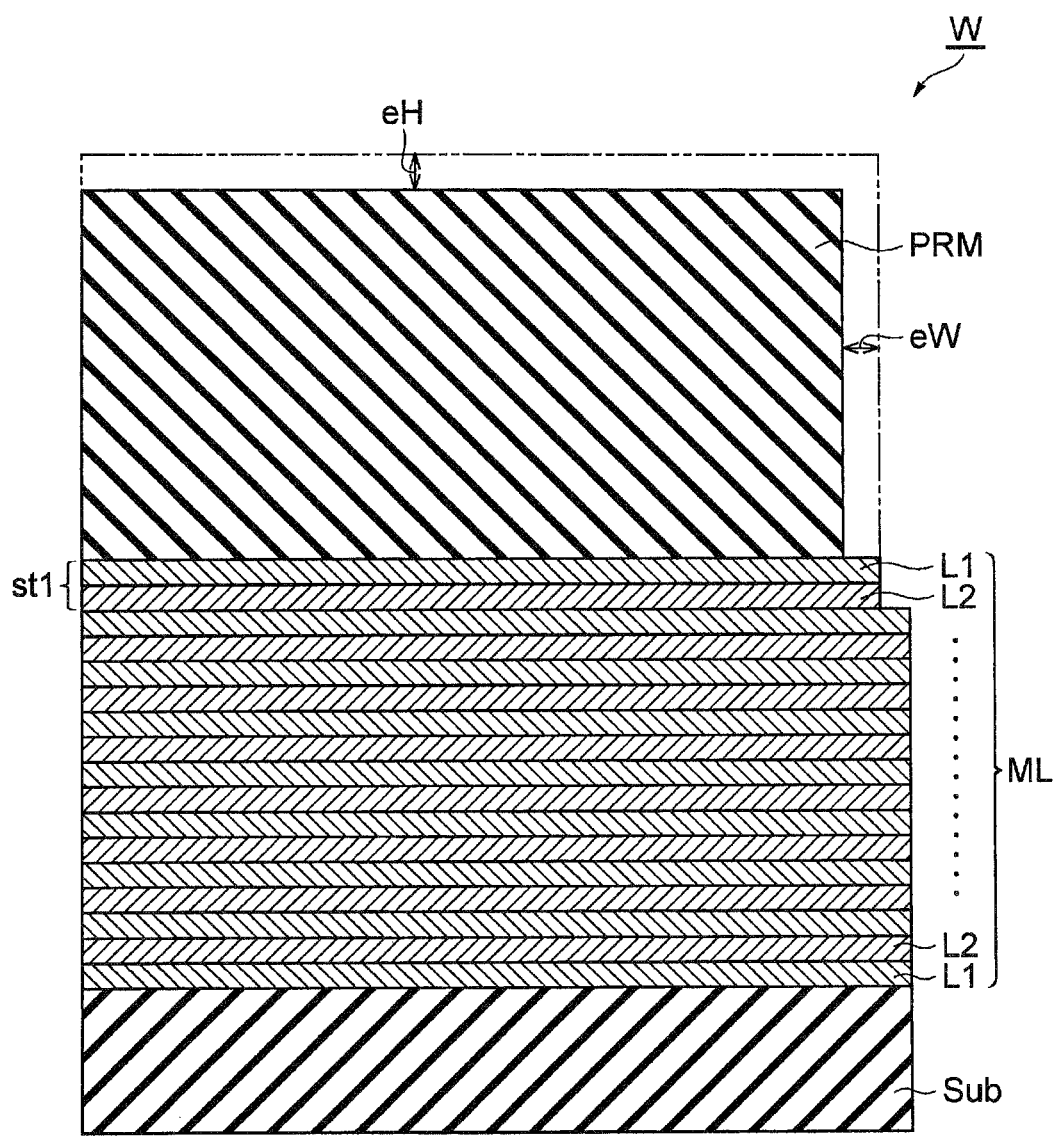

In the step S3, a step of reducing the resist mask PRM is performed. In this step S3, a plasma of an oxygen-containing gas and a fluorocarbon-based gas is excited by using the microwave as an excitation source. Here, the fluorocarbon-based gas means a compound in which part or all of hydrogen of alkane is substituted by fluorine, and which contains hydrofluorocarbon. In addition, in one embodiment, the oxygen-containing gas is $O_2$ gas. In this step S3, the resist mask PRM is etched and reduced in the vertical direction as well as the horizontal direction, as shown in FIG. 7.

In the step S3 of this method, the microwave is used as an excitation source of the plasma. Thus, energy of ions generated in the plasma is lower than energy of ions generated by another plasma processing apparatus such as an inductively coupled plasma processing apparatus. Thus, in this method, radicals are dominantly used as active species contributing to the etching of the resist mask PRM. Further, in this method, the fluorocarbon-based gas in addition to the oxygen-containing gas is used. The fluorocarbon-based gas improves the etching rate of the resist mask PRM, and also promotes the etching using radicals. Ions and radicals mainly contribute to the etching of the resist mask PRM in the vertical direction while radicals mainly contribute to the etching of the resist mask PRM in the horizontal direction. Therefore, according to the step S3 of the method, the amount of the resist mask PRM etched in the horizontal direction becomes close to the amount of the resist mask PRM etched in the vertical direction, so that a trimming ratio of the resist mask PRM becomes close to 1. In addition, the trimming ratio is defined by (amount eH of the resist mask PRM etched in the vertical direction)/(amount eW of the resist mask PRM etched in the horizontal direction) (see FIG. 7).

In one embodiment, the fluorocarbon-based gas used in the step S3 may be $CF_4$ gas. By using the $CF_4$ gas as the fluorocarbon-based gas, the generation of deposits on the resist mask PRM due to the fluorocarbon-based gas is suppressed. As a result, the linearity of the stepped edge formed in the multilayer film ML is higher. For example, line edge roughness (LER) becomes smaller. Meanwhile, as the fluorocarbon-based gas, for example, a gas such as $CHF_3$ gas, $CH_3F$ gas, and $C_2H_xF_{6-x}$ gas may be used instead of or together with the $CF_4$ gas. Here, x is an integer between 0 and 5.

When performing the step S3 in the plasma processing apparatus 10, the control unit Cont executes a second control. Specifically, in the second control, the control unit Cont transmits a control signal to allow the microwave generator 28 to generate the microwave, and to allow the gas sources G16 and G12 of the gas supply unit GS to supply $O_2$ gas and $CF_4$ gas into the processing chamber 12. Thus, the plasma of the $O_2$ gas and $CF_4$ gas is excited, and the resist mask PRM is etched.

Figure 8:
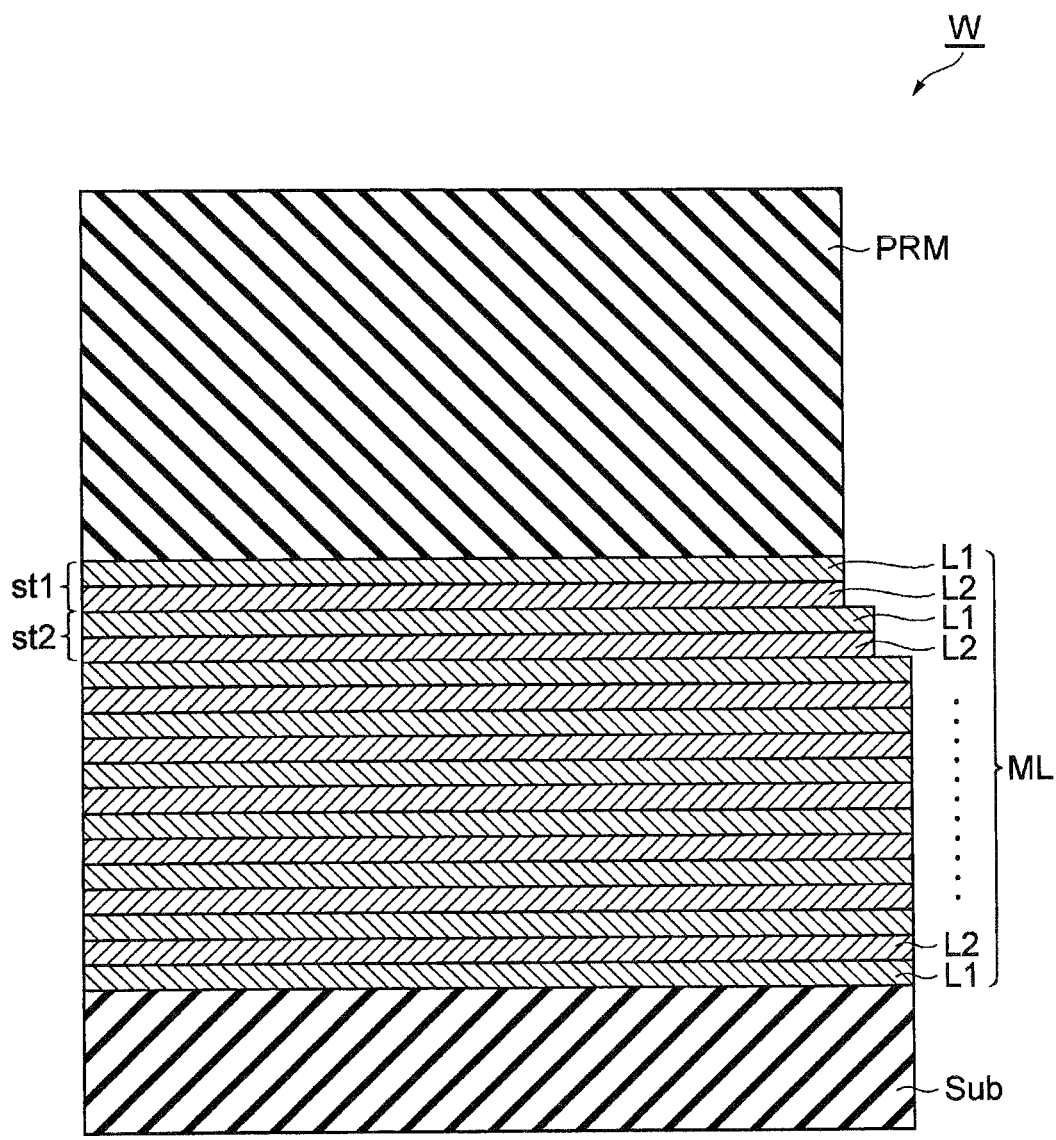
Figure 9:
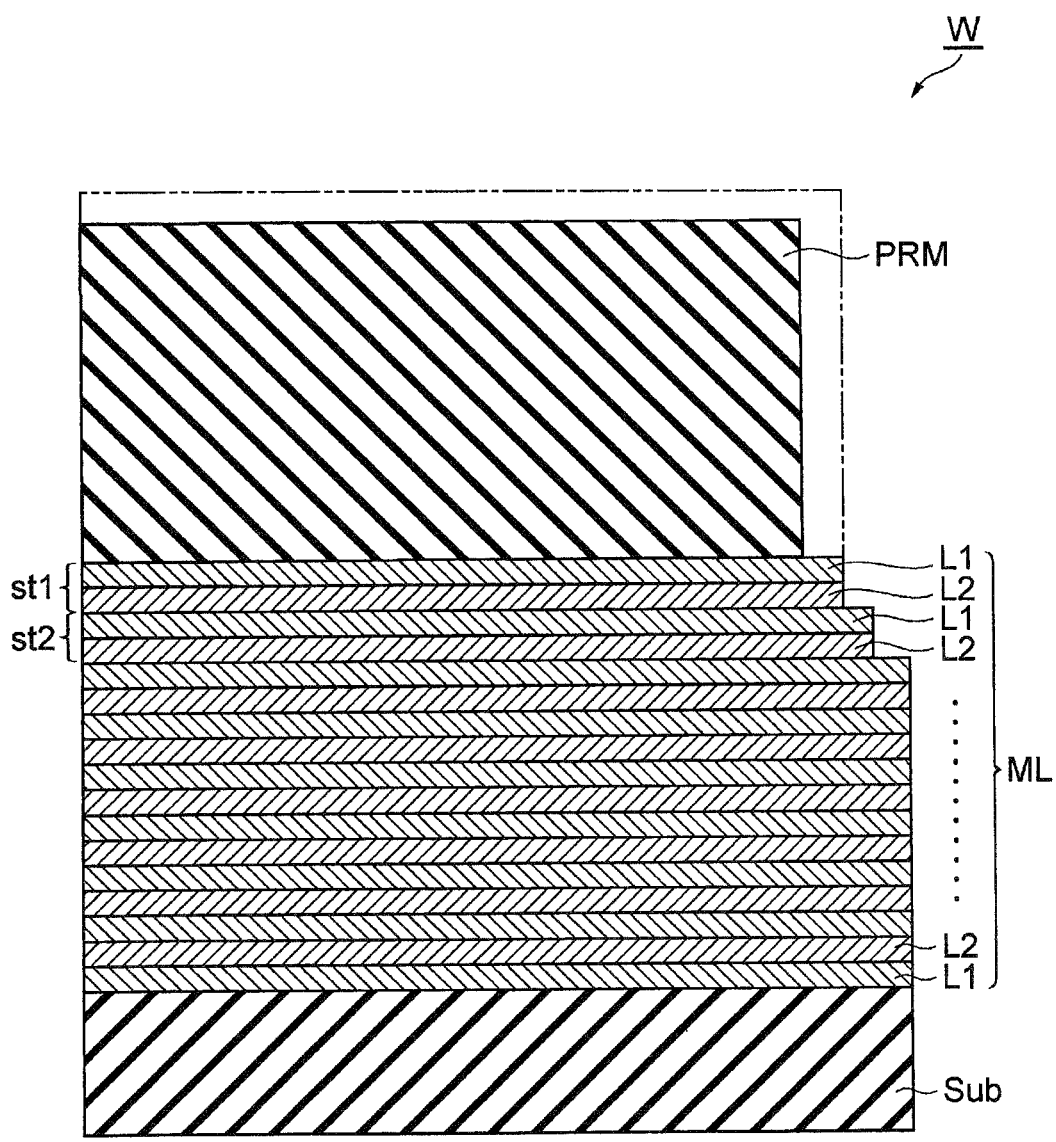
Figure 10:
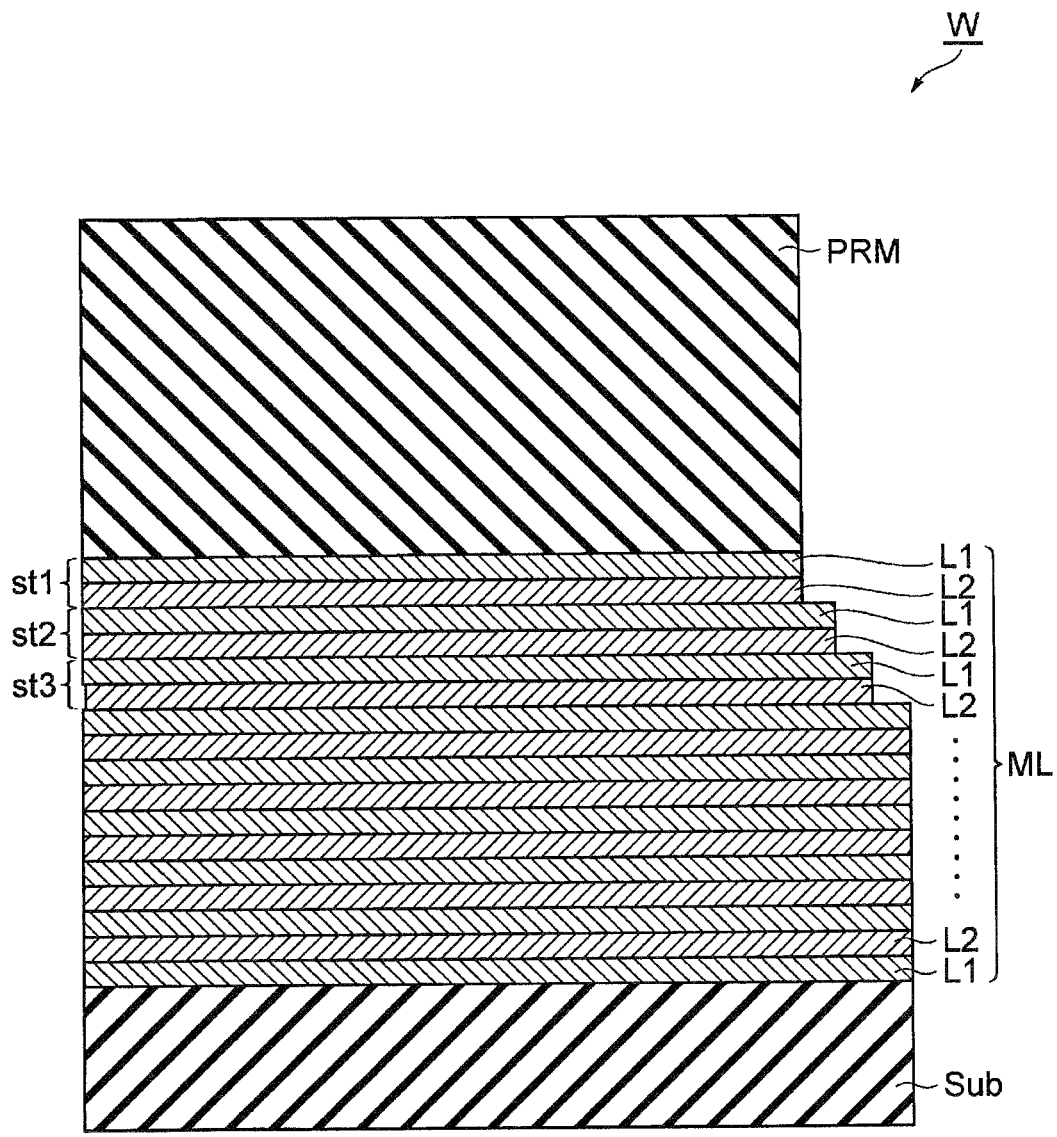

In this method, subsequently, the step S1 of the second cycle is performed on the target object W which has undergone the step S3 of the first cycle. Thus, as shown in FIG. 8, the first layer L1 and the second layer L2 of the uppermost stage st1 and the first layer L1 and the second layer L2 of the next stage st2, which are exposed from the resist mask PRM, are etched. Then, the step S3 of the second cycle is performed on the target object W which has undergone the step S1 of the second cycle. Thus, as shown in FIG. 9, the resist mask PRM is further etched, and the resist mask PRM is reduced. Then, the step S1 of the third cycle is performed on the target object W which has undergone the step S3 of the second cycle. Thus, as shown in FIG. 10, the first layer L1 and the second layer L2 of the uppermost stage st1, the first layer L1 and the second layer L2 of the next stage st2, and the first layer L1 and the second layer L2 of the further next stage st3, which are exposed from the resist mask PRM, are etched.

Figure 11:
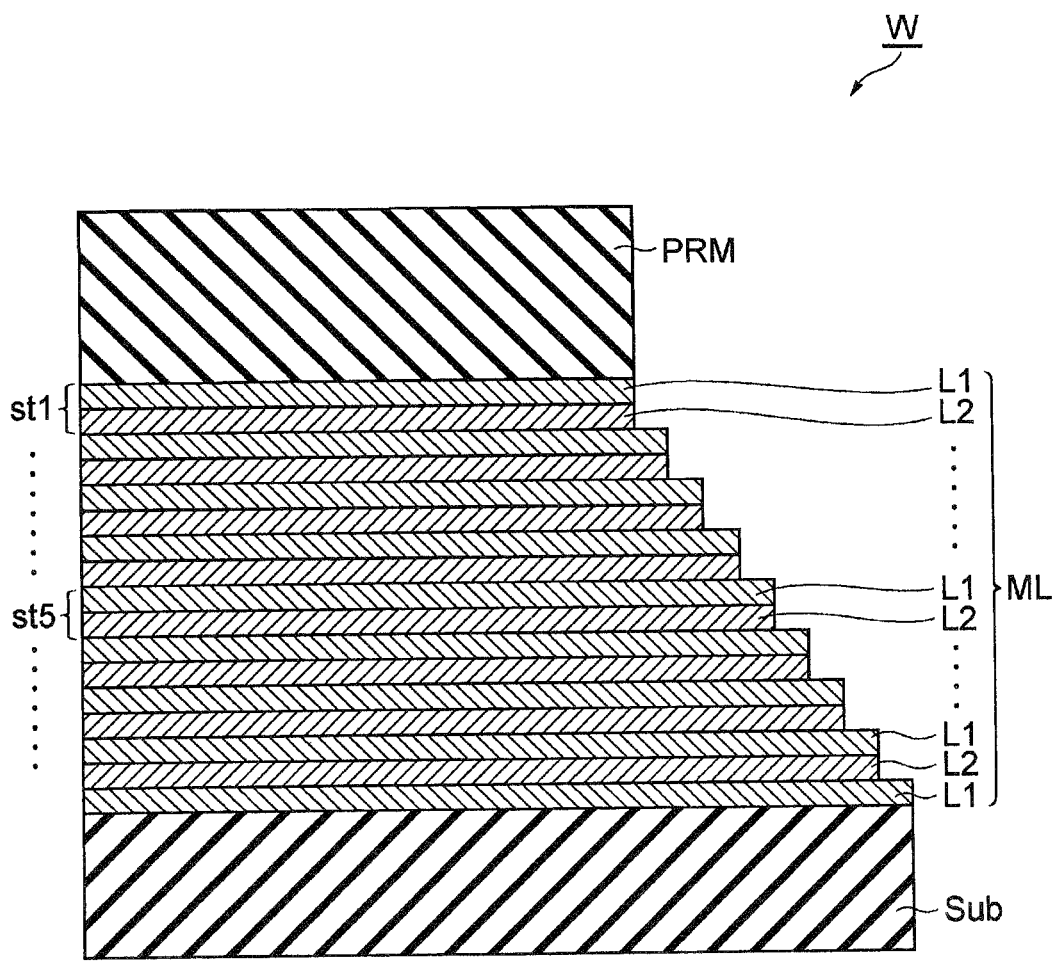

As described above, in this method, the step S3 and the step S1 are alternately repeated until it is determined in step S2 that the etching of the predetermined number of cycles has been performed. Thus, as shown in FIG. 11, a multistage stepped shape is formed in an edge portion of the multilayer film ML. When this method is carried out in the plasma processing apparatus 10, the control unit Cont of the plasma processing apparatus 10 repeats the first control and the second control as described above for a predetermined number of cycles.

As described above, in the method that can be performed by using the plasma processing apparatus 10, the trimming ratio of the resist mask PRM becomes close to 1. Therefore, it is possible to reduce the thickness of the resist mask PRM required to form a multistage stepped shape in the edge portion of the multilayer film ML. As a result, it is possible to reduce the material cost. In addition, it is possible to improve exposure accuracy of the resist mask PRM, thereby achieving high accuracy in the stepped shape of the multilayer film.

In addition, in the method that can be performed by using the plasma processing apparatus 10, the step S1 and the step S3 are repeated alternately without depositing a protective film on the resist mask PRM between the step S1 and the step S3. By a process of depositing the protective film on the resist mask PRM, particularly, the upper surface of the resist mask PRM, it may be possible to make the trimming ratio close to 1, or smaller than 1. However, the throughput is reduced due to this process.

On the other hand, in this method, the step S1 and the step S3 are repeated alternately without performing the process of depositing the protective film on the resist mask PRM between the step S1 and the step S3, and therefore it becomes possible to make the trimming ratio close to 1 without reducing the throughput.

In the embodiment, when repeating the step S3 for the predetermined number of cycles, the period of the step S3 in at least one cycle may be set to be shorter than the period of the step S3 in the previous cycle of the at least one cycle. For example, in the repetition of the step S3, the period of the step S3 may be set to decrease gradually. If the step S3 is repeated while the period of the step S3 is kept the same in each cycle, the amount of the resist mask PRM etched in the horizontal direction may be increased gradually as the step S3 is repeated for the predetermined number of cycles. This is because the amount of the resist mask is reduced in the vicinity of the pattern. On the other hand, when the period of the step S3 is set to decrease gradually in the repetition of the step central introducing unit 22 when the total flow rate of the gas introduced from the central introducing unit 22 and the peripheral introducing unit 24 is 100.

The target object W was one having a diameter of 300 mm and including the resist mask PRM having a thickness of 5800 nm. In addition, the first layer L1 was a $SiO_2$ film having a thickness of 30 nm, and the second layer L2 was a SiN film having a thickness of 30 nm.

TABLE 1

|  | Common Step S1 | | | | | | | |
| --- | --- | --- | --- | --- | --- | --- | --- | --- |
|  | Step S1a | Step S1b | Exp. 1 Step S3 | Exp. 2 Step S3 | Com. 1 Step S3 | Com. 2 Step S3 | Com. 3 Step S3 | Com. 4 Step S3 |
| Pressure in processing chamber [mTorr]([Pa]) | 20 (2.666) | 40 (5.333) | 150 (20) | 150 (20) | 150 (20) | 150 (20) | 150 (20) | 150 (20) |
| Microwave frequency [GHz] | 2.45 | 2.45 | 2.45 | 2.45 | 2.45 | 2.45 | 2.45 | 2.45 |
| Microwave power [W] | 1700 | 2000 | 3500 | 4500 | 3500 | 4500 | 3500 | 4500 |
| RF bias power Frequency [MHz] | 13.65 | 13.65 | 13.65 | 13.65 | 13.65 | 13.65 | 13.65 | 13.65 |
| Power [W] | 150 | 200 | 0 | 0 | 0 | 0 | 0 | 0 |
| Ar gas [sccm] | 500 | 110 | 0 | 0 | 0 | 0 | 0 | 0 |
| $CF_4$ gas [sccm] | 100 | 0 | 50 | 50 | 0 | 0 | 0 | 0 |
| $CH_3F$ gas [sccm] | 0 | 55 | 0 | 0 | 0 | 0 | 0 | 0 |
| $O_2$ gas [sccm] | 0 | 35 | 800 | 800 | 800 | 800 | 800 | 800 |
| $SF_6$ gas [sccm] | 0 | 0 | 0 | 0 | 0 | 0 | 50 | 50 |
| RDC value | 0 | 0 | 0 | 0 | 0 | 0 | 0 | 0 |
| Temperature of target object [° C.] | 60 | 60 | 60 | 60 | 60 | 60 | 60 | 60 |
| Period [sec] | 20 | 15 | 45 | 45 | 45 | 45 | 45 | 45 |

S3, it becomes possible to reduce a difference in the amount of the resist mask PRM etched in the horizontal direction when repeating the step S3 for the predetermined number of cycles.

Although various embodiments have been described, various modifications may be made without being limited to the embodiments described above. For example, the first layer L1 and the second layer L2 may have different dielectric constants from each other, and for example, the second layer L2 may be a polysilicon layer.

Hereinafter, there will be described experimental examples and comparative examples conducted by using the plasma processing apparatus 10.

Experimental Examples 1 and 2 and Comparative Examples 1 to 4

In experimental examples 1 and 2 and comparative examples 1 to 4, the step S1 and the step S3 were repeated alternately on the target object W shown in FIG. 3 such that the step S1 of eight cycles and the step S3 of seven cycles were performed under the conditions shown in Table 1. Specifically, in each of the experimental examples 1 and 2, the step S3 was carried out by using a mixed gas of $O_2$ gas and $CF_4$ gas and a different microwave power. In each of the comparative examples 1 and 2, the step S3 was carried out by using $O_2$ gas alone and a different microwave power. In each of the comparative examples 3 and 4, the step S3 was carried out by using a mixed gas of $O_2$ gas and $SF_6$ gas and a different microwave power.

Figure 12A:
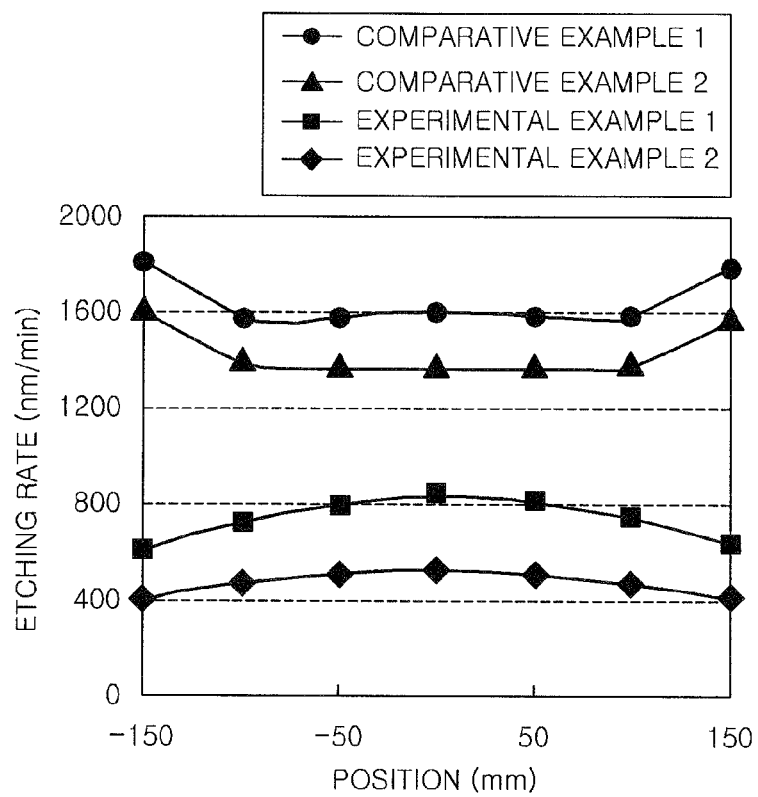
FIGS. 12A and 12B respectively show a measurement result of an etching rate of a resist mask in each of experimental examples 1 and 2 and comparative examples 1 and 2, and a measurement result of XPS in the experimental example 2.
Figure 12B:
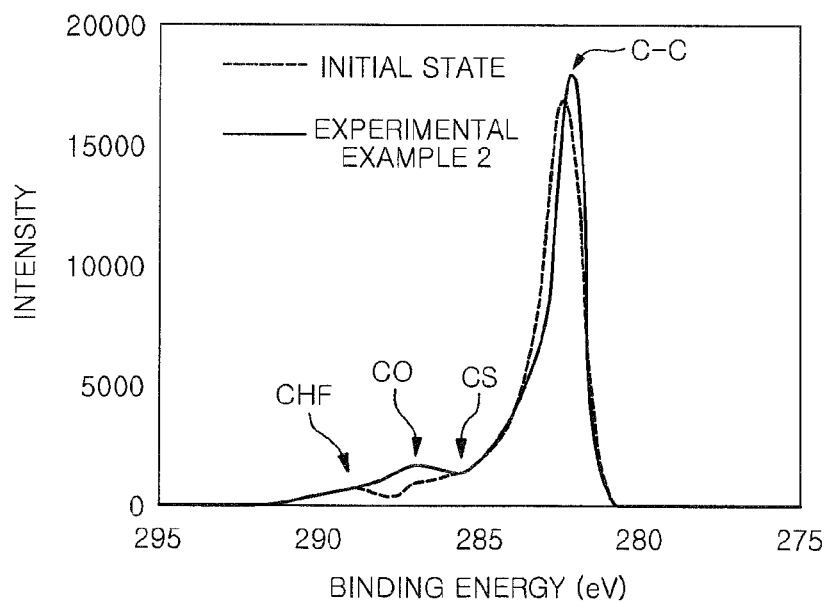
Figure 13A:
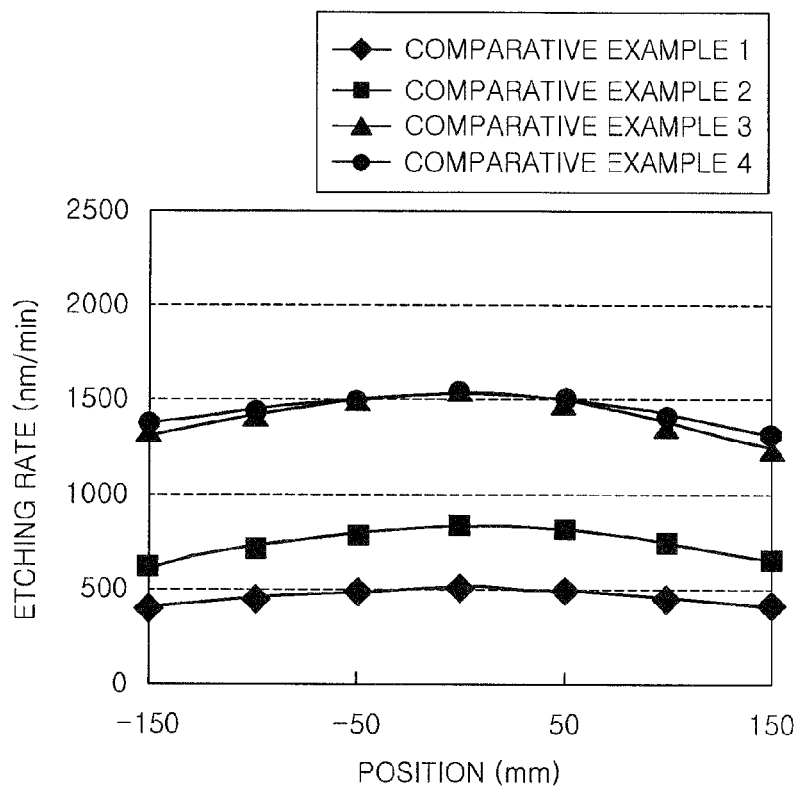
FIGS. 13A and 13B respectively show a measurement result of the etching rate of the resist mask in each of the comparative examples 1 and 2 and comparative examples 3 and 4, and a measurement result of XPS in the comparative example 4.

In Table 1, the "common" indicates the conditions of the step S1, which are common to all of the experimental examples 1 and 2 and the comparative examples 1 to 4. The "RDC value" indicates the flow rate of the gas from the In each of the experimental examples 1 and 2 and the comparative examples 1 to 4, the etching rate of the resist mask PRM in the diametric direction of the target object W was measured. In addition, for each of the experimental example 2 and the comparative example 4, the states of the surface of the resist mask PRM before and after the processing under the above-described conditions were measured by using X-ray photoelectron spectroscopy (XPS). FIG. 12A shows a measurement result of the etching rate of the resist mask PRM in each of the experimental examples 1 and 2 and the comparative examples 1 and 2, and FIG. 12B shows a measurement result of X-ray photoelectron spectroscopy in the experimental example 2. FIG. 13A shows a measurement result of the etching rate in each of the comparative examples 1 to 4, and FIG. 13B shows a measurement result of X-ray photoelectron spectroscopy in the comparative example 4.

In FIG. 12A and FIG. 13A, the horizontal axis represents the radial position of the target object W when the center of the target object W is set to "0," and the vertical axis represents the etching rate of the resist mask PRM at each position. In FIG. 12B and FIG. 13B, the horizontal axis represents the binding energy, and the vertical axis represents the intensity measured at each binding energy. In addition, in each of FIG. 12B and FIG. 13B, a measurement result of the "initial state" indicates the measurement result of X-ray photoelectron spectroscopy for the resist mask PRM before the processing.

As shown in FIG. 12A and FIG. 13A, in the experimental examples 1 and 2 and the comparative examples 3 and 4 in which the resist mask PRM was etched using $CF_4$ gas or $SF_6$ gas together with $O_2$ gas, etching rates were higher compared to etching rates in the comparative examples 1 and 2 in which the resist mask PRM was etched using $O_2$ gas alone. Thus, from the experimental examples 1 and 2 and the comparative examples 1 to 4, it has been found that the etching rate of the resist mask PRM is increased by etching the resist mask PRM using $CF_4$ gas or $SF_6$ gas together with $O_2$ gas as compared to the etching rate when the resist mask PRM is etched using $O_2$ gas alone.

Figure 13B:
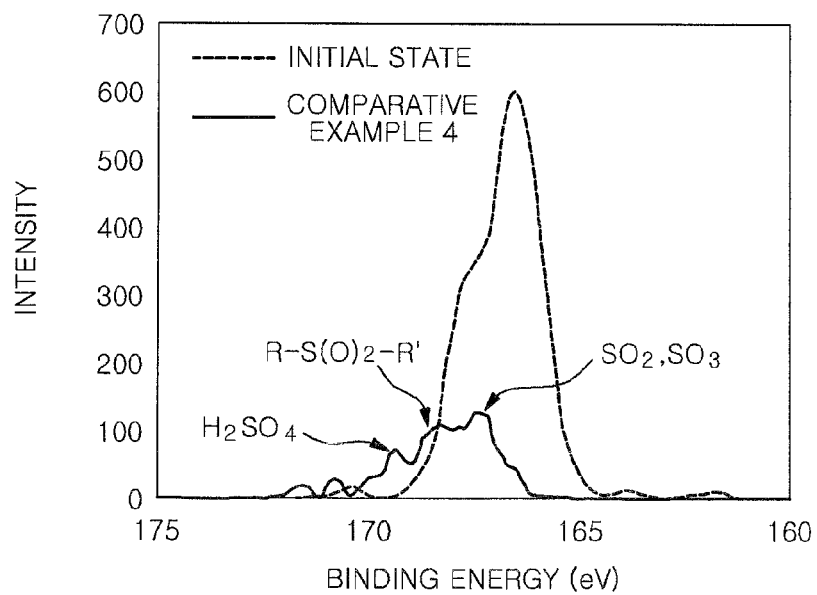

Further, as shown in FIG. 13B, in the case of etching the resist mask PRM using a mixed gas of $O_2$ gas and $SF_6$ gas, the measurement result of X-ray photoelectron spectroscopy for the resist mask PRM after the processing (see Comparative Example 4) was significantly different from the initial state, i.e., the measurement result of X-ray photoelectron spectroscopy for the resist mask PRM before the processing. The reason is because the deposits caused by $SF_6$ gas were deposited on the resist mask PRM when performing the step S3 using a mixed gas of $O_2$ gas and $SF_6$ gas.

On the other hand, as shown in FIG. 12B, in the case of performing the step S3 using a mixed gas of $O_2$ gas and $CF_4$ gas, the measurement result of X-ray photoelectron spectroscopy for the resist mask PRM after the processing was substantially the same as the initial state, i.e., the measurement result of X-ray photoelectron spectroscopy for the resist mask PRM before the processing. Therefore, it has been found that no deposits are generated on the resist mask PRM in the case of etching the resist mask PRM using a mixed gas of $O_2$ gas and $CF_4$ gas.

Figure 14A:
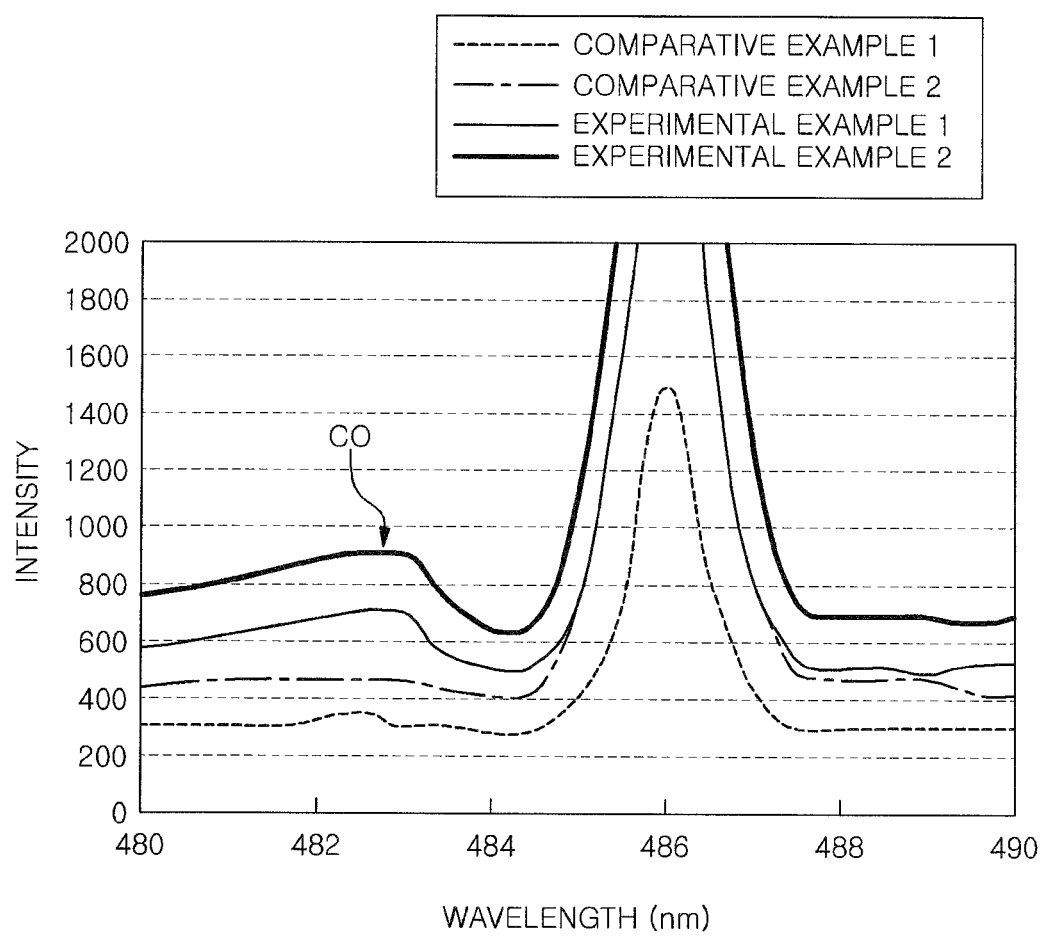
FIGS. 14A and 14B respectively show a measurement result of OES in each of the experimental examples 1 and 2 and the comparative examples 1 and 2, and a difference in the OES measurement intensity between the experimental example 2 and the comparative example 2.

Next, an emission state in the processing chamber 12 when performing the step S3 in each of the experimental examples 1 and 2 and the comparative examples 1 and 2 was measured by optical emission spectroscopy (OES). The measurement results are shown in FIG. 14A. Further, a result of subtracting intensity values of the OES measurement result of the comparative example 2 from intensity values of the OES measurement result of the experimental example 2 is shown in FIG. 14B.

As shown in FIG. 14A, in each of the experimental examples 1 and 2, as compared with the comparative examples 1 and 2, the intensity at a wavelength of 483 nm due to CO binding and the intensity at a wavelength of 486.1 nm due to hydrogen were increased. It is considered that the increase in the intensity at these wavelengths was due to an increase in the etching rate of the resist mask PRM by performing the step S3 by adding $CF_4$ gas to $O_2$ gas.

Figure 14B:
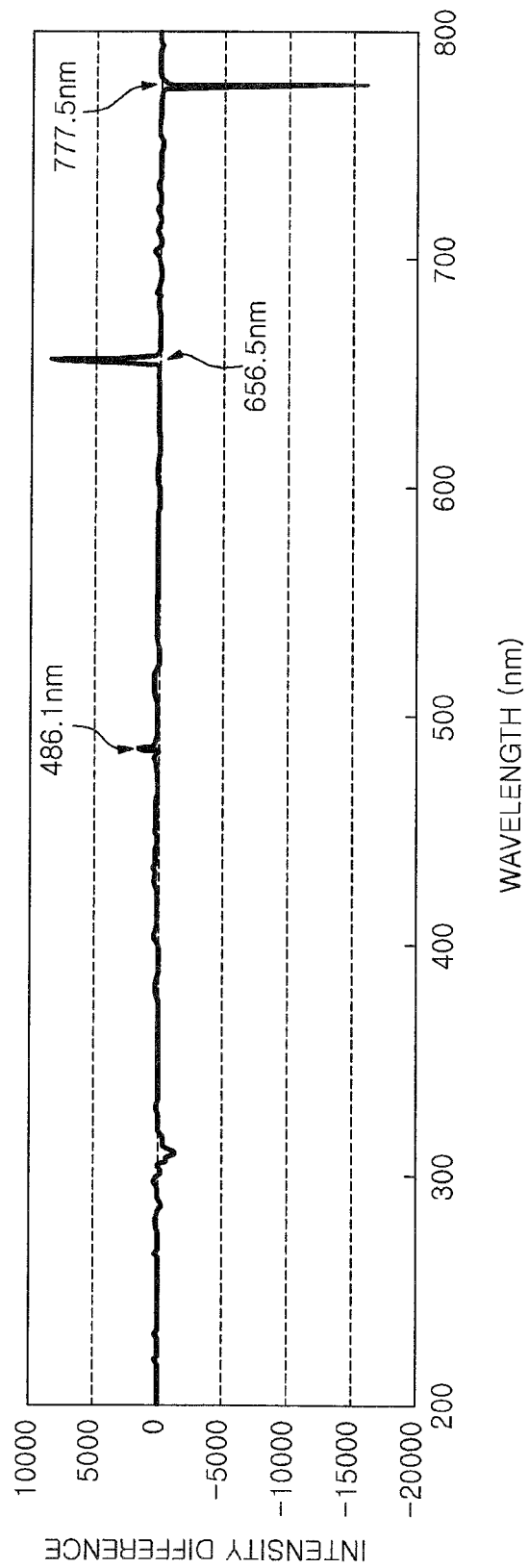

Further, as shown in FIG. 14B, by adding $CF_4$ gas to $O_2$ gas in the experimental example 2, the intensity at a wavelength of 777.5 nm due to oxygen was reduced, but the intensity at a wavelength of 486.1 nm and a wavelength of 656.6 nm due to hydrogen was increased as compared to the comparative example 2. It is considered that the increase in the intensity at these wavelengths 486.1 nm and 656.6 nm was due to an increase in the etching rate of the resist mask PRM. Therefore, it has been found that the amount of oxygen radicals is decreased, but the etching rate of the resist mask PRM is increased in the case of adding $CF_4$ gas to $O_2$ gas in the step S3 as compared to the case of using $O_2$ gas alone in the step S3.

Experimental Examples 3 and 4 and Comparative Example 5

In experimental examples 3 and 4 and a comparative example 5, the step S1 and the step S3 were repeated alternately on the target object W shown in FIG. 3 such that the step S1 of eight cycles and the step S3 of seven cycles were performed under the conditions shown in Table 2. Specifically, in each of the experimental examples 3 and 4, the step S3 was carried out by using a mixed gas of $O_2$ gas and $CF_4$ gas while varying the flow rate of $CF_4$ gas. In the comparative example 5, the step S3 was carried out using $O_2$ gas alone.

In Table 2, the "common" indicates the conditions of the step S1, which are common to all of the experimental examples 3 and 4 and the comparative Example 5. The target object W was one having a diameter of 300 mm and including the resist mask PRM having a thickness of 5800 nm. In addition, the first layer L1 was a $SiO_2$ film having a thickness of 30 nm, and the second layer L2 was a SiN film having a thickness of 30 nm.

TABLE 2

|  | Common Step S1 | | Exp. 3 | Exp. 4 | Com. 5 |
| --- | --- | --- | --- | --- | --- |
|  | Step S1a | Step S1b | Step S3 | Step S3 | Step S3 |
| Pressure in processing chamber [mTorr] ([Pa]) | 20 (2.666) | 40 (5.333) | 150 (20) | 150 (20) | 150 (20) |
| Microwave frequency [GHz] | 2.45 | 2.45 | 2.45 | 2.45 | 2.45 |
| Microwave power [W] | 1700 | 2000 | 3500 | 3500 | 3500 |
| RF bias power Frequency [MHz] | 13.65 | 13.65 | 13.65 | 13.65 | 13.65 |
| Power [W] | 150 | 200 | 0 | 0 | 0 |
| Ar gas [sccm] | 500 | 110 | 0 | 0 | 0 |
| $CF_4$ gas [sccm] | 100 | 0 | 100 | 50 | 0 |
| $CH_3F$ gas [sccm] | 0 | 55 | 0 | 0 | 0 |
| $O_2$ gas [sccm] | 0 | 35 | 390 | 390 | 390 |
| $SF_6$ gas [sccm] | 0 | 0 | 0 | 0 | 0 |
| RDC value | 0 | 0 | 0 | 0 | 0 |
| Temperature of target object [° C.] | 60 | 60 | 60 | 60 | 60 |
| Period [sec] | 20 | 15 | 45 | 45 | 45 |

Figure 15A:
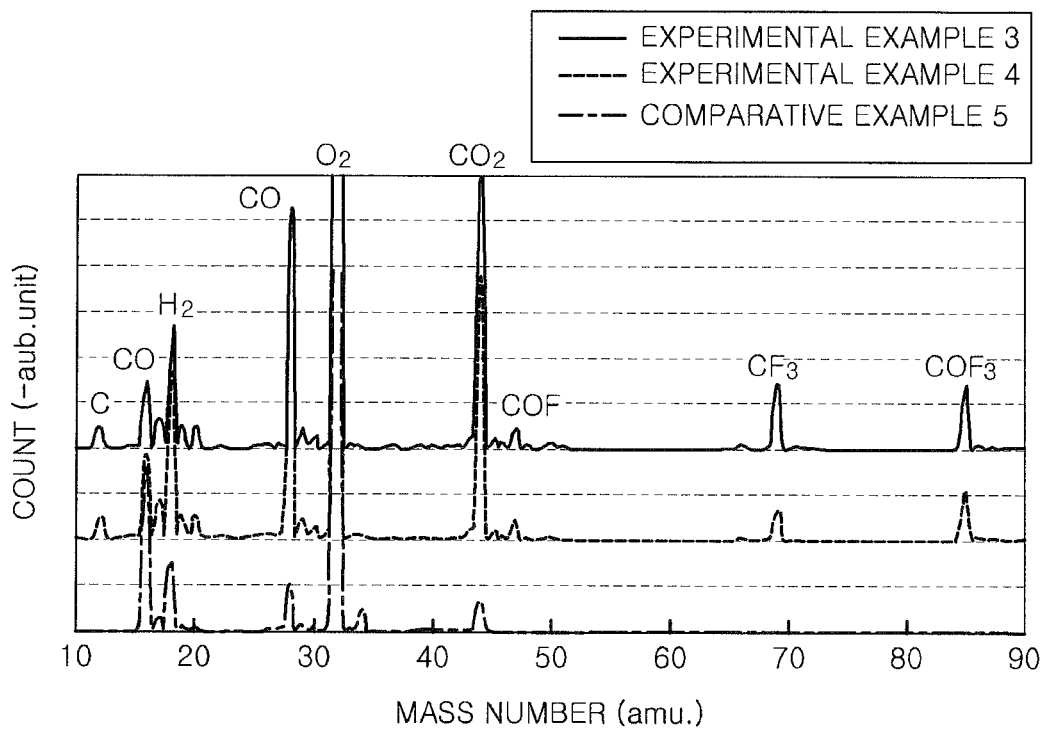
FIGS. 15A and 15B show measurement results of OES in each of the experimental examples 3 and 4 and the comparative example 5.
Figure 15B:
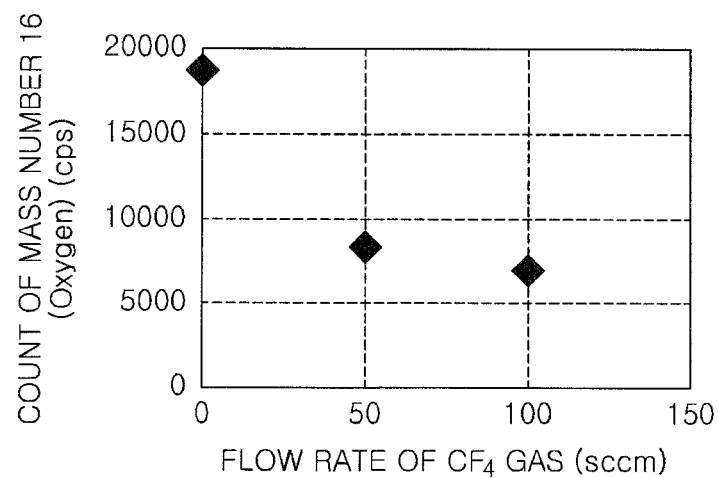

In each of the experimental examples 3 and 4 and the comparative example 5, the composition of the radicals generated in the processing chamber 12 in the step S3 was investigated by using a quadrupole mass spectrometer (QMS). FIG. 15A shows a graph of a measurement result of the quadrupole mass spectrometer in each of the experimental examples 3 and 4 and the comparative example 5, wherein the horizontal axis represents a mass number, and the vertical axis represents a count. FIG. 15B shows a graph representing a relationship between the flow rate of $CF_4$ gas and the count of the mass number 16 (i.e., oxygen radicals) that was obtained from the measurement result of the quadrupole mass spectrometer in each of the experimental examples 3 and 4 and the comparative example 5.

As shown in FIG. 15A, it has been found that species containing fluorine such as $COF_x$ was not detected in the comparative example 5 of etching the resist mask PRM using $O_2$ gas alone, but they were generated in the processing chamber 12 in each of the experimental examples 3 and 4 in which the flow rate of $CF_4$ gas used together with $O_2$ gas was increased in the step S3. Further, as shown in FIG. 15B, it has been found that the amount of oxygen radicals was reduced as the flow rate of $CF_4$ gas used together with $O_2$ gas in the step S3 was increased. In addition, as a result of measuring the ion energy in the step S3 of the experimental examples 3 and 4 and the ion energy in the step S3 of the comparative example 5 by using a quadrupole mass spectrometer (QMS), there was no significant difference between the ion energy in the step S3 in the experimental examples 3 and 4 and the ion energy in the step S3 in the comparative example 5. Thus, it has been found that even though the flow rate of $CF_4$ gas used together with $O_2$ gas in the step S3 was increased, etching using ions was not promoted while etching using radicals was promoted.

Experimental Example 5 and Comparative Example 6

In an experimental example 5 and a comparative example 6, the step S1 and the step S3 were repeated alternately on the target object W shown in FIG. 3 such that the step S1 of four cycles and the step S3 of four cycles were performed under the conditions shown in Table 3. Further, in the comparative example 6 alone, a step of forming a protective film shown in Table 3 was performed between the step S1 and the step S3.

In Table 3, the "common" indicates the conditions of the steps S1 and S3, which are common to both of the experimental example 5 and the comparative example 6. The target object W was one having a diameter of 300 mm and including the resist mask PRM having a thickness of 3500 nm. In addition, the first layer L1 was a $SiO_2$ film having a thickness of 20 nm, and the second layer L2 was a polysilicon film having a thickness of 30 nm.

TABLE 3

|  | Common | | | Com. 6 Forming protective film |
|---|---|---|---|---|
|  | Step S1 | | | |
|  | Step S1a | Step S1b | Step S3 | |
| Pressure in processing chamber [mTorr] ([Pa]) | 20 (2.666) | 100 (13.33) | 150 (19.995) | 20 (2.666) |
| Microwave frequency [GHz] | 2.45 | 2.45 | 2.45 | 2.45 |
| Microwave power [W] | 1700 | 2000 | 3500 | 2000 |
| RF bias power  Frequency [MHz] | 13.65 | 13.65 | 13.65 | 13.65 |
| Power [W] | 150 | 150 | 0 | 0 |
| Ar gas [sccm] | 500 | 1150 | 0 | 110 |
| $CF_4$ gas [sccm] | 100 | 0 | 50 | 0 |
| HBr gas [sccm] | 0 | 450 | 0 | 0 |
| $O_2$ gas [sccm] | 3 | 3 | 800 | 0 |
| $CH_2F_2$ gas [sccm] | 0 | 0 | 0 | 25 |
| RDC value | 5 | 30 | 30 | 5 |
| Temperature of target object [° C.] | 60 | 60 | 60 | 60 |
| Period [sec] | 15 | 15 | 20 | 60 |

Figure 16A:
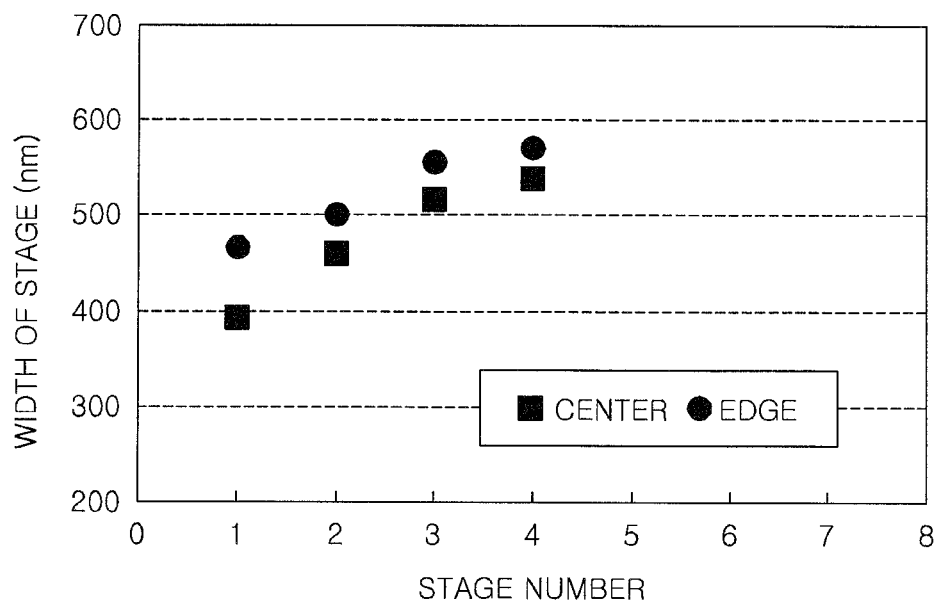
FIGS. 16A and 16B respectively show width of each stage of the multilayer film of the stepped shape of the target object obtained in the experimental example 5 and the comparative example 6.
Figure 16B:
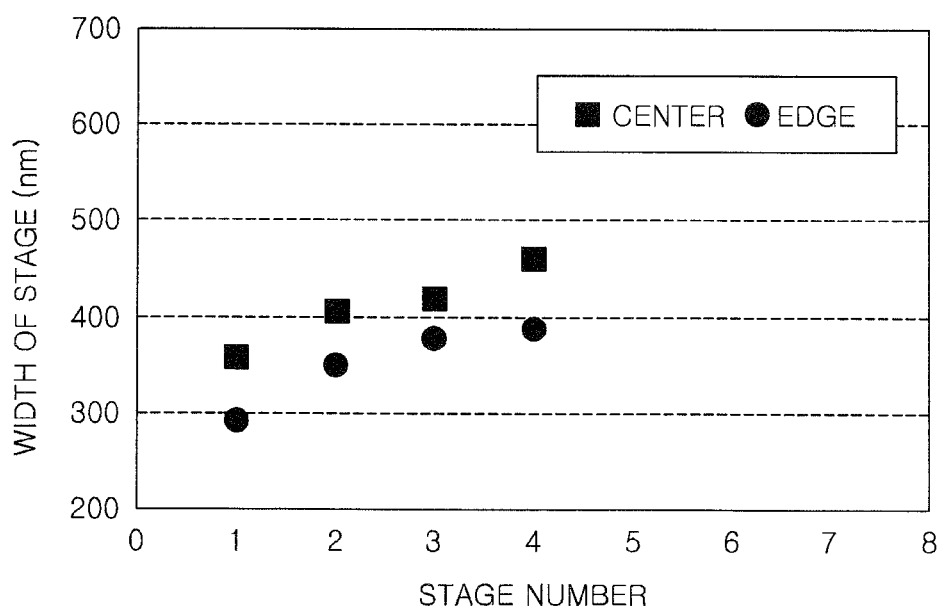

The widths of the stages measured from SEM photographs of the stepped shape of the multilayer film of the target object W, which were obtained in the experimental example 5 and the comparative example 6, are shown in FIGS. 16A and 16B, respectively. In FIGS. 16A and 16B, the horizontal axis represents the stage number which is a number assigned from the top in descending order and the vertical axis represents the width of the stage. In FIGS. 16A and 16B, the width of each stage obtained in the vicinity of the edge and the center of the target object W is illustrated. Here, the "width of the stage" is the width of the top surface of each stage in the direction in which a plurality of stages are arranged in the stepped shape.

Comparing FIG. 16A which shows the width of each stage obtained from the target object W in the experimental example 5 and FIG. 16B which shows the width of each stage obtained from the target object W in the comparative example 6, it has been found that the width of the stage in the comparative example 6 was smaller than the width of the stage in the experimental example 6.

Experimental Example 6 and Comparative Example 7

In an experimental example 6 and a comparative example 7, the step S1 and the step S3 were repeated alternately on the target object W such that the step S1 of four cycles and the step S3 of four cycles were performed under the conditions shown in Table 4. Further, in the comparative example 7 alone, a step of forming a protective film shown in Table 4 was performed between the step S1 and the step S3.

In Table 4, the "common" indicates the conditions of the steps S1 and S3, which are common to both of the experimental example 6 and the comparative example 7. The target object W was one having a diameter of 300 mm and including the resist mask PRM having a thickness of 3500 nm. In addition, the first layer L1 was a $SiO_2$ film having a thickness of 20 nm, and the second layer L2 was a polysilicon film having a thickness of 30 nm.

TABLE 4

|  | Common | | | Com. 7 Forming protective film |
|---|---|---|---|---|
|  | Step S1 | | | |
|  | Step S1a | Step S1b | Step S3 | |
| Pressure in processing chamber [mTorr] ([Pa]) | 20 (2.666) | 100 (13.33) | 150 (20) | 10 (1.333) |
| Microwave frequency [GHz] | 2.45 | 2.45 | 2.45 | 2.45 |
| Microwave power [W] | 1700 | 2000 | 3500 | 3500 |
| RF bias power  Frequency [MHz] | 13.65 | 13.65 | 13.65 | 13.65 |
| Power [W] | 150 | 150 | 0 | 0 |
| Ar gas [sccm] | 500 | 1150 | 0 | 110 |
| $CF_4$ gas [sccm] | 100 | 0 | 50 | 0 |
| HBr gas [sccm] | 0 | 450 | 0 | 0 |
| $O_2$ gas [sccm] | 0 | 10 | 800 | 0 |
| $CH_2F_2$ gas [sccm] | 0 | 0 | 0 | 45 |
| RDC value | 5 | 30 | 30 | 5 |
| Temperature of target object [° C.] | 60 | 60 | 60 | 60 |
| Period [sec] | 12 | 12 | 20 | 30 |

For the edge of each stage in the stepped shape obtained in each of the experimental example 6 and the comparative example 7, the Line Edge Roughness (LER) was obtained from SEM photographs. Specifically, 3σ of the LER was obtained at an edge position of each stage in the direction in which a plurality of stages are arranged in the stepped shape. As a result, the LERs of the respective stages in the experimental example 6 were 22.6 nm, 25.0 nm, 27.3 nm, and 24.7 nm in order from the top. Further, the LERs of the respective stages in the comparative example 7 were 35.7 nm, 37.2 nm, 35.8 nm, and 28.0 nm in order from the top. As was clear from the comparison of the LERs of the stages in the experimental example 6 and the comparative example 7, it has been found that the linearity of the edge of each stage in the stepped shape was higher when the step of forming the protective film between the step S1 and the step S3 was not performed.

Experimental Example 7

In an experimental example 7, the step S3 was carried out on the target object W under the conditions shown in Table 5. Specifically, in the experimental example 7, the step S3 was carried out by changing the flow rate of $CF_4$ gas. The target object W was one having a diameter of 300 mm and including the resist mask PRM having a thickness of 5800 nm.

TABLE 5

|  |  | Step S3 |
| --- | --- | --- |
| Pressure in processing chamber [mTorr] ([Pa]) |  | 200 (26.66) |
| Microwave power [GHz] |  | 3500 |
| RF bias power | Frequency [MHz] | 13.65 |
|  | Power [W] | 0 |
| $CF_4$ gas [sccm] |  | *** |
| $O_2$ gas [sccm] |  | 800 |
| RDC value |  | 30 |
| Temperature of target object [° C.] |  | 60 |
| Period [sec] |  | 45 |

Further, in the experimental example 7, the etching rate and the trimming ratio of the resist mask PRM were obtained from the resultant target object W. Specifically, the etching rate and the trimming ratio of the resist mask PRM of the target object on each of four diameters at intervals of 45° were measured at seven spots at intervals of 50 μm. Then, the average of the etching rate, 3σ, a range (%) and the average of the trimming ratio were obtained. Here, the range (%) was a value obtained by dividing the difference between the maximum value and the minimum value of the etching rate by the etching rate.

Figure 17:
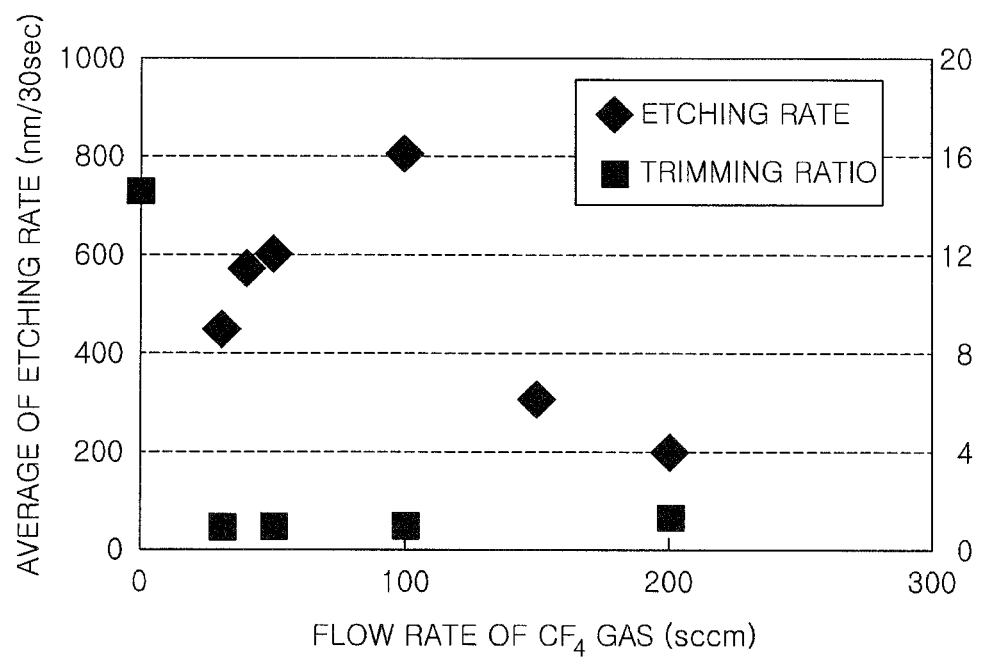
FIG. 17 shows a relationship between a flow rate of $CF_4$ gas, the etching rate of the resist mask and a trimming ratio in a step S3 which are obtained in an experimental example 7.

FIG. 17 shows a relationship between the flow rate of $CF_4$ gas, the average of the etching rate and the average of the trimming ratio in the step S3. In FIG. 17, the horizontal axis represents the flow rate of $CF_4$ gas in the step S3, the left vertical axis represents the etching rate of the resist mask PRM, the right vertical axis represents the trimming ratio. In addition, a relationship between the flow rate of $CF_4$ gas, the average of the etching rate, 3σ of the etching rate, the range (%), and the average of the trimming ratio is shown in Table 6.

TABLE 6

|  | Flow rate of $CF_4$ gas | | | | | | |
| --- | --- | --- | --- | --- | --- | --- | --- |
|  | 0 | 30 | 40 | 50 | 100 | 150 | 200 |
| Average of etching rate (nm/30 sec) |  | 451.6 | 566.1 | 603.8 | 806.6 | 311.7 | 208.1 |
| 3σ of etching rate |  | 60.8 | 61.6 | 62.6 | 26.8 | 20.5 | 25.3 |
| Range (%) |  | 21.8 | 21.9 | 22.1 | 9.6 | 11.1 | 12.7 |
| Average of trimming ratio | 14.6 | 1.17 |  | 1.15 | 1.07 |  | 1.32 |

As shown in FIG. 17 and Table 6, it has been found that the trimming ratio becomes close to 1 by using $CF_4$ gas together with $O_2$ gas in the step S3. Further, when the flow rate of $CF_4$ gas was 100 sccm, the etching rate was maximized. Furthermore, as is apparent from the relationship between the flow rate of $CF_4$ gas and the range (%), it has been found that a variation in etching rate at a plurality of locations of the target object W is decreased when the flow rate of $CF_4$ gas is 100 sccm.

Experimental Examples 8 and 9

In an experimental examples 8 and 9, the step S1 and the step S3 were repeated alternately on the target object W shown in FIG. 3 such that such that the step S1 of eight cycles and the step S3 of seven cycles were performed. In the experimental example 8, the period of the step S3 in each cycle was fixed to 20 seconds, and in the experimental example 9, the period of the step S3 was set to 18.5 seconds, 17.8 seconds, 17.5 seconds, 17.2 seconds, 17.0 seconds, 17.1 seconds, and 17.1 seconds in order of cycle. That is, in the experimental example 9, except the period of the step S3 in the final cycle, the period of the step S3 was reduced as the step S3 was repeated. The other conditions of the experimental examples 8 and 9 are shown in Table 7. The target object W was one having a diameter of 300 mm and including the resist mask PRM having a thickness of 5800 nm. In addition, the first layer L1 was a $SiO_2$ film having a thickness of 30 nm, and the second layer L2 was a SiN film having a thickness of 30 nm.

TABLE 7

|  | Common | | |
| --- | --- | --- | --- |
|  | Step S1 | | |
|  | Step S1a | Step S1b | Step S3 |
| Pressure in processing chamber [mTorr] ([Pa]) | 20 (2.666) | 40 (5.333) | 110 (14.67) |
| Microwave frequency [GHz] | 2.45 | 2.45 | 2.45 |
| Microwave power [W] | 3000 | 2000 | 4500 |
| RF bias power Frequency [MHz] | 13.65 | 13.65 | 13.65 |
| Power [W] | 250 | 600 | 0 |
| Ar gas [sccm] | 950 | 110 | 0 |
| $CF_4$ gas [sccm] | 200 | 0 | 50 |
| HBr gas [sccm] | 0 | 55 | 0 |
| $O_2$ gas [sccm] | 0 | 15 | 800 |
| $CH_2F_2$ gas [sccm] | 0 | 0 | 0 |
| RDC value | 5 | 5 | 30 |
| Temperature of target object [° C.] | 60 | 60 | 60 |
| Period [sec] | 12 | 12 | *** |

In each of the experimental example 8 and the experimental example 9, an amount of trimming according to the step S3 in each cycle was obtained. Here, the amount of trimming was the amount (nm) in which the resist mask PRM was etched in the horizontal direction. Relationships between the amount of trimming and the cycle of the step S3 in the experimental example 8 and the experimental example 9 are shown in FIGS. 18A and 18B, respectively.

Figure 18A:
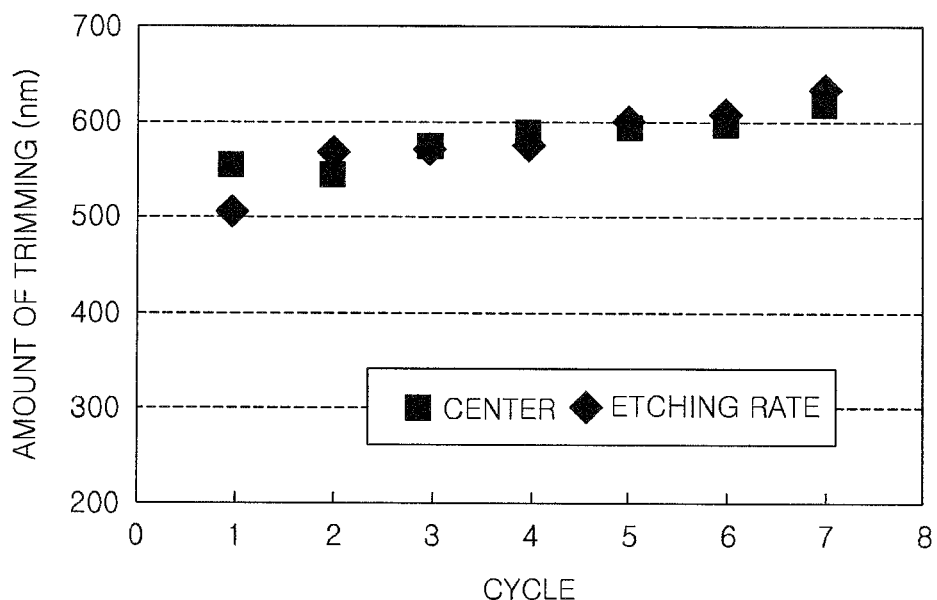
FIGS. 18A and 18B respectively show relationships between the number of cycles and the trimming ratio of the resist mask in an experimental example 8 and an experimental example 9.
Figure 18B:
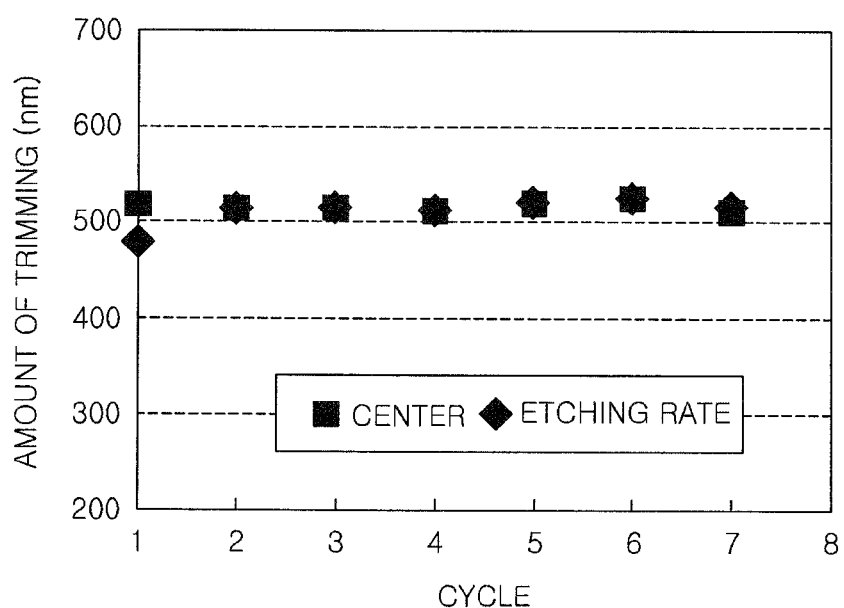

In FIGS. 18A and 18B, the horizontal axis represents the cycle, and the vertical axis represents the amount of trimming. Further, the amount of trimming obtained in the vicinity of the edge and the center of the target object W is illustrated in each of FIGS. 18A and 18B. As shown in FIG. 18A, in the experimental example 8 in which the period of the step S3 in each cycle was the same, the amount of trimming of the resist mask PRM became larger as the step S3 was repeated. On the other hand, as shown in FIG. 18B, in the experimental example 9 in which the period of the step S3 was reduced as the step S3 was repeated, it has been found that the amount of trimming of the resist mask PRM in all cycles was substantially the same.

What is claimed is:

1. A method for etching a multilayer film formed by laminating a plurality of alternating layers of a first layer having a first dielectric constant and a second layer having a second dielectric constant, wherein a resist mask is formed on the multilayer film, the method comprising:
  etching the multilayer film by supplying an etchant gas into a processing chamber and supplying a microwave into the processing chamber to excite a plasma of the etchant gas; and
  reducing the resist mask by supplying an oxygen-containing gas and a fluorocarbon-based gas into the processing chamber and supplying a microwave into the processing chamber to excite a plasma of the oxygen-containing gas and the fluorocarbon-based gas and provide a trimming ratio (amount of the resist mask etched in a vertical direction)/(amount of the resist mask etched in a horizontal direction) which is close to 1,
  wherein said etching the multilayer film and said reducing the resist mask are alternately repeated.

2. The method of claim 1, wherein the fluorocarbon-based gas is $CF_4$ gas.

3. The method of claim 1, wherein said reducing the resist mask is repeated for a predetermined number of cycles, and a period of said reducing the resist mask in at least one cycle is set to be shorter than a period of said reducing the resist mask performed in one previous cycle of the at least one cycle.

4. The method of claim 1, wherein said etching the multilayer film and said reducing the resist mask are alternately repeated without forming a protective film on the resist mask between said etching the multilayer film and said reducing the resist mask.

5. The method of claim 1, wherein the microwave is supplied from a radial line slot antenna into the processing chamber.

6. The method of claim 1, further including, during etching the multilayer film, supplying RF power into the processing chamber, and during reducing the resist mask the RF power is turned off.

7. A plasma processing apparatus for forming a stepped shape in a multilayer film, which is formed by laminating a plurality of alternating layers of a first layer having a first dielectric constant and a second layer having a second dielectric constant by using a resist mask formed on the multilayer film, the apparatus comprising:

a processing chamber;
  a gas supply system configured to supply a first etchant gas for the first layer and a second etchant gas for the second layer, an oxygen-containing gas and a fluorocarbon-based gas into the processing chamber;
  a plasma source configured to supply a microwave into the processing chamber; and
  a control unit configured to control the gas supply system and the plasma source,
  wherein the control unit alternately repeats a first control for allowing the gas supply system to supply the first and the second etchant gas and allowing the plasma source to supply the microwave and etch the first and second layers, and a second control for allowing the gas supply system to supply the oxygen-containing gas and the fluorocarbon-based gas and allowing the plasma source to supply the microwave to reduce the resist mask and provide a trimming ratio (amount of the resist mask etched in a vertical direction)/(amount of the resist mask etched in a horizontal direction) which is close to 1.

8. The plasma processing apparatus of claim 7, wherein the fluorocarbon-based gas is $CF_4$ gas.

9. The plasma processing apparatus of claim 7, wherein the control unit repeats the second control for a predetermined number of cycles, and sets a period of the second control in at least one cycle to be set shorter than a period of the second control performed in one previous cycle of the at least one cycle.

10. The plasma processing apparatus of claim 7, wherein the control unit alternately repeats the first control and the second control without performing a control of depositing deposits on the resist mask to protect the resist mask between the first control and the second control.

11. The plasma processing apparatus of claim 7, wherein the plasma source includes a radial line slot antenna configured to supply the microwave into the processing chamber.

12. The apparatus of claim 7, wherein:
  the plasma source is further configured to supply RF power to the processing chamber; and
  the control unit is configured to control the plasma source so that both microwave and RF power are supplied to the processing chamber during the first control, and during the second control to reduce the resist mask the microwave is supplied to the processing chamber and the RF power is turned off.

* * * * *